United States Patent
Takamine

(10) Patent No.: US 6,816,036 B2
(45) Date of Patent: Nov. 9, 2004

(54) SURFACE ACOUSTIC WAVE FILTER AND COMMUNICATION APPARATUS

(75) Inventor: Yuichi Takamine, Kanazawa (JP)

(73) Assignee: Murata Manufacturing Co. Ltd, Kyoto (JP)

( * ) Notice: Subject to any disclaimer, the term of this patent is extended or adjusted under 35 U.S.C. 154(b) by 0 days.

(21) Appl. No.: 10/205,983

(22) Filed: Jul. 26, 2002

(65) Prior Publication Data

US 2003/0025576 A1 Feb. 6, 2003

(30) Foreign Application Priority Data

Jul. 27, 2001 (JP) ........................................ 2001-228673

(51) Int. Cl.[7] ................................................ H03H 9/00
(52) U.S. Cl. ...................... 333/195; 333/193; 333/196; 310/313 B; 310/313 D
(58) Field of Search ................................ 333/193, 195, 333/196; 310/313 B, 313 D

(56) References Cited

U.S. PATENT DOCUMENTS

| 5,717,274 | A | * | 2/1998 | Eguchi et al. | .......... | 310/313 R |
| 5,986,524 | A | * | 11/1999 | Shimoe | ...................... | 333/195 |
| 6,255,916 | B1 | * | 7/2001 | Nakamura et al. | .......... | 333/195 |
| 6,259,336 | B1 | * | 7/2001 | Ichikawa | ..................... | 333/193 |
| 6,329,888 | B1 | * | 12/2001 | Hirota | ......................... | 333/195 |
| 6,583,691 | B2 | * | 6/2003 | Takamine | .................. | 333/195 |
| 2001/0054942 | A1 | * | 12/2001 | Takamine et al. | ........... | 333/195 |

FOREIGN PATENT DOCUMENTS

| JP | 07-030367 | 1/1995 |
| JP | 09-246901 | 9/1997 |
| JP | 09-326669 | 12/1997 |
| TW | 449967 | 8/2001 |
| WO | WO 00/76067 A1 | 12/2000 |

* cited by examiner

Primary Examiner—Michael Tokar
Assistant Examiner—Nguyen Khai
(74) Attorney, Agent, or Firm—Keating & Bennett LLP

(57) ABSTRACT

A SAW filter includes a plurality of IDTs arranged on substrate along a SAW propagation direction, and balanced signal terminals connected to an IDT. The SAW filter is a floating balanced type. The plurality of IDTs are arranged so as to provide a horizontally asymmetrical structure with respect to an imaginary axis that is positioned at the approximate center of the center IDT in the SAW propagation direction and which is substantially perpendicular to the SAW propagation direction. Thus, a SAW filter having filtering characteristics and a balance-to-unbalance conversion function is achieved with high balance between the balanced signal terminals.

42 Claims, 22 Drawing Sheets

SURFACE ACOUSTIC WAVE FILTER AND COMMUNICATION APPARATUS

BACKGROUND OF THE INVENTION

1. Field of the Invention

The present invention relates to a surface acoustic wave filter having filtering characteristics and, in particular, a balance-to-unbalance conversion function, and to a communication apparatus including the surface acoustic wave filter.

2. Description of the Related Art

Recently, there has been significant technological progress in reducing the size and weight of cellular telephones. In order to achieve these advantages, in addition to reducing the number and size of components, multi-function components are being increasingly developed. In the state of the art, recent research has been actively conducted regarding surface acoustic wave (SAW) filters having a balance-to-unbalance conversion function, i.e., a so-called "balun" function, which are used in the RF (radio frequency) stage of cellular telephones. Such SAW filters are used mostly for GSM (global system for mobile communications) compliant devices.

If a balanced line such as a twin lead feeder is directly coupled to an unbalanced line such as a coaxial cable, an unbalanced current flows, thereby, undesirably, causing the feeder itself to operate as an antenna. A circuit called a balun is thus required for preventing the unbalanced current in order to match the balanced line to the unbalanced line.

Many patent applications pertaining to SAW filters having a balance-to-unbalance conversion function have been filed. A well-known SAW filter having a balance-to-unbalance conversion function and having an input impedance and output impedance which are substantially equal to each other is illustrated in FIG. 19.

In the SAW filter shown in FIG. 19, a comb-like electrode (also called an interdigital transducer, hereinafter referred to as an "IDT") 101 is provided on a piezoelectric substrate 100. IDTs 102 and 103 are positioned on the left and right sides of the IDT 101, respectively, in the surface acoustic wave (SAW) propagation direction.

Reflectors 104 and 105 for reflecting a surface acoustic wave in order to improve the conversion efficiency are further arranged in the SAW filter in such a manner that the reflectors sandwich the IDTs 101, 102, and 103 therebetween from the left and right. The SAW filter further includes balanced signal terminals 106 and 107, and an unbalanced signal terminal 108.

The SAW filter of this type is called a three-IDT longitudinally coupled resonator SAW filter having a balance-to-unbalance conversion function by performing conversion between the IDTs 101, 102, and 103 using a surface acoustic wave.

In a SAW filter having a balance-to-unbalance conversion function, it is required that the transmission characteristics in the pass band between an unbalanced signal terminal and each balanced signal terminal have equal amplitude characteristics and 180°-out-of-phase characteristics. The amplitude characteristic and the phase characteristic are referred to as "amplitude balance" and "phase balance" between the balanced signal terminals, respectively.

The amplitude balance and the phase balance are defined as follows. If the SAW filter having a balance-to-unbalance conversion function is a three-port device consisting of, for example, a first port corresponding to an unbalanced input terminal and second and third ports corresponding to balanced output terminals, the amplitude balance=[A], where A=|20log(S21)|−|20log(S31)|, and the phase balance=B−180, where B=|∠S21−∠S31|. In the above equations, S21 denotes the transfer coefficient from the first port to the second port, S31 denotes the transfer coefficient from the first port to the third port, and || indicates an absolute value.

In balance between the balanced signal terminals, ideally, the amplitude balance and the phase balance are 0 dB and 0 degree, respectively, in the pass band of a SAW filter.

However, the SAW filter in the conventional art shown in FIG. 19 has a problem in that balance between the balanced signal terminals is low. As one possible reason, the distance (indicated by a portion 109 in FIG. 19) between an electrode finger connected to the balanced signal terminal 106 and a signal electrode finger of the IDT 102 is different from the distance (indicated by a portion 110 in FIG. 19) between an electrode finger connected to the balanced signal terminal 107 and a signal electrode finger of the IDT 103 by 0.5 times the wavelength defined by the pitch between the electrode fingers.

This leads to additional problems in that the total capacitance of the electrode fingers connected to the balanced signal terminal 106 is different from the that of the electrode fingers connected to the balanced signal terminal 107, and that the conversion efficiency between an electrical signal and a surface acoustic wave is different between the balanced signal terminals 106 and 107, resulting in low balance. FIG. 20 shows that the balanced signal terminal 107 shown in FIG. 19 is connected to the ground, and FIG. 21 shows that the balanced signal terminal 106 shown in FIG. 19 is connected to the ground. FIG. 22 shows the difference between the frequency-amplitude characteristic output from the balanced signal terminal 106 in FIG. 20 and the frequency-amplitude characteristic output from the balanced signal terminal 107 in FIG. 21. There is a large difference between the two amplitude characteristics, and this difference causes low balance.

SUMMARY OF THE INVENTION

In order to overcome the problems described above, preferred embodiments of the present invention provide a surface acoustic wave filter having a balance-to-unbalance conversion function that compensates for the above-described difference between balanced signal terminals, which causes low balance between the balanced signal terminals, and that achieves satisfactory balance between the balanced signal terminals, and also the preferred embodiments of the present invention provide a communication apparatus including such a SAW filter.

According to a preferred embodiment of the present invention, a SAW filter includes a piezoelectric substrate, an IDT set disposed on the piezoelectric substrate, and a balanced signal terminal connected to the interdigital transducer set. The IDT set includes, along a SAW propagation direction, a plurality of IDTs for converting an input electrical signal into a surface acoustic wave and outputting the surface acoustic wave, and for converting a propagating surface acoustic wave into an output electrical signal and outputting the output electrical signal. The IDT set is asymmetric with respect to an imaginary axis which is located at the center of the IDT set in the SAW propagation direction and which is substantially perpendicular to the SAW propagation direction.

The IDT set may include an odd number of IDTs. The imaginary axis may be located at the approximately central portion of the IDT which is centrally located among the plurality of the IDTs, and may be substantially perpendicular to the SAW propagation direction.

The distances between adjacent IDTs in the IDT set are different such that the interdigital transducer set is asymmetric with respect to the imaginary axis.

The ratios (duties) of the electrode finger widths relative to the pitches of the IDT set may be different such that the interdigital transducer set is asymmetric with respect to the imaginary axis.

The pitches of the interdigital transducer set are different such that the interdigital transducer set is asymmetric with respect to the imaginary axis.

The IDT set may include narrower-pitch electrode finger portions at portions where two IDTs are adjacent to each other, each narrower-pitch electrode finger portion including several electrode fingers having a smaller pitch than that of the other electrode fingers. The pitches of the narrower-pitch electrode finger portions may be different such that the interdigital transducer set is asymmetric with respect to the imaginary axis.

With this configuration, the IDT set having a plurality of IDTs in the SAW propagation direction can achieve a filtering function which allows specific frequency band components to pass while other components to be stopped.

In this configuration, a balanced signal terminal connected to the IDT set does not have an electrically neutral point and therefore is of a floating balanced type, thus implementing a balance-to-unbalance conversion function while making it possible to relatively readily set an imaginary axis that is positioned at the approximate center of the IDT set in the SAW propagation direction and which is substantially perpendicular to the propagation direction.

In this configuration, the IDT set is configured so as to be asymmetric with respect to the imaginary axis. For example, the distances between adjacent IDTs are asymmetric with respect to the imaginary axis, the duties of the IDT set are asymmetric with respect to the imaginary axis, or the narrower-pitch electrode finger portions provided on the IDT set are asymmetric with respect to the imaginary axis. This increases balance, in particular, the phase balance.

Accordingly, a SAW filter performing both a filtering function and a balance-to-unbalance conversion function in which balance, in particular, the phase balance, is improved can be achieved, and can also be suitably used for communication apparatuses such as cellular telephones and other apparatuses.

In the SAW filter, preferably, at least one SAW resonator is connected at least in series or in parallel to the IDT set. The SAW resonator connected to the IDT set increases the filtering function.

In another preferred embodiment of the present invention, a communication apparatus includes a surface acoustic wave filter having any of the foregoing configurations according to various preferred embodiments described above. With use of a surface acoustic wave filter performing both a filtering function and a balance-to-unbalance conversion function in which balance, in particular, the phase balance, is improved, the communication capability is greatly improved.

Other features, elements, characteristics and advantages of the present invention will become more apparent from the following detailed description thereof with reference to the attached drawings.

DETAILED DESCRIPTION OF PREFERRED EMBODIMENTS

Preferred embodiments of the present invention are now described with reference to FIGS. 1 to 19.

Figure 1:
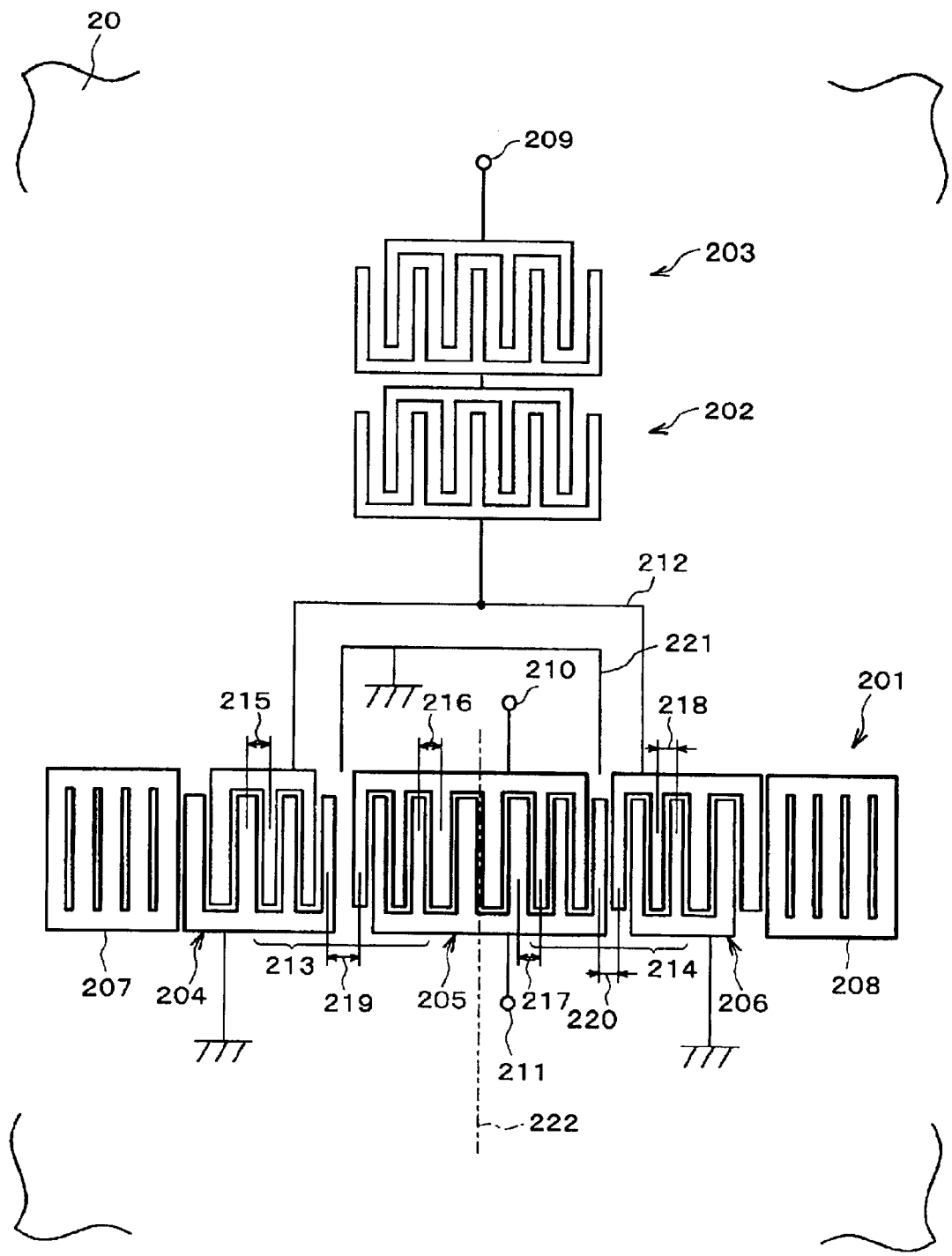
FIG. 1 is a schematic diagram of a SAW filter according to a first preferred embodiment of the present invention.

In a SAW filter according to a first preferred embodiment of the present invention, as shown in FIG. 1, on a piezoelectric substrate 20, a longitudinally coupled resonator SAW filter unit (IDT set) 201, and SAW resonators 202 and 203 connected in series to the SAW filter unit 201 are formed of an aluminum (Al) electrode (foil) produced by a technique such as photolithography. The piezoelectric substrate 20 may preferably be a 40±5° Y-cut X-propagating LiTaO$_3$ substrate. The following preferred embodiments of the present invention are described in the context of a PCS (personal communication system) reception SAW filter but are not limited thereto.

The SAW filter unit 201 includes an IDT 205, and IDTs 204 and 206, which sandwich the IDT 205 therebetween from the left and right in the SAW propagation direction. The SAW filter unit 201 further includes reflectors 207 and 208 positioned next to the IDTs 204 and 206, respectively.

The IDTs 204, 205, and 206 each have two electrode finger portions each including a strip base portion (bus bar) and a plurality of strip electrode fingers extending substantially parallel to each other and extending substantially perpendicular from one side of the base portion. The electrode finger portions are configured so that the electrode fingers of one electrode finger portion are interleaved with the electrode fingers of the other electrode finger portion such that the sides thereof face each other.

In any of the IDTs 204, 205, and 206, if a potential difference occurs due to electrical signals input to the two electrode finger portions via the base portions (bus bars), a surface acoustic wave is produced at that portion on a surface of the piezoelectric substrate 20. The surface acoustic wave then propagates across the surface of the piezoelectric substrate 20 in a bi-directional manner in the width direction of the electrode fingers, i.e., in the direction that is substantially perpendicular to the length of the electrode fingers. In an IDT to which no electrical signal is input, the potential difference produced on the surface of the piezoelectric substrate 20 by the propagating surface acoustic wave is detected by the electrode fingers, and is converted into an output electrical signal, which is then output.

In the IDTs 204, 205, and 206, the signal conversion characteristic or the pass band can be determined by setting the length and width of each electrode finger, the pitch between adjacent electrode fingers, and the interdigital length which means the length by which the interleaved electrode fingers face each other. The reflectors 207 and 208 reflect a propagating surface acoustic wave.

As is apparent from FIG. 1, in the SAW filter unit 201, the pitch between some electrode fingers (narrower-pitch electrode fingers) near the portion (indicated by a portion 213) where the adjacent IDTs 204 and 205 face each other is smaller than the pitch between the other electrode fingers of the IDTs 204 and 205. Likewise, the pitch between some electrode fingers (narrower-pitch electrode fingers) near the portion (indicated by a portion 214) where the adjacent IDTs 205 and 206 face each other is narrower than the pitch between the other electrode fingers of the IDTs 205 and 206. Thus, the insertion loss in the SAW filter unit 201 is significantly reduced.

Balanced signal terminals 210 and 211 are connected to the electrode finger portions of the center IDT 205. Then, the SAW filter unit 201 does not have a ground potential as an electrically neutral point, and therefore is of the floating balanced type. An unbalanced signal terminal 209 is connected to one electrode finger portion in each of the IDTs 204 and 206. The other electrode finger portion in each of the IDTs 204 and 206 is connected to the ground.

Connecting the balanced signal terminals 210 and 211 and the unbalanced signal terminal 209 in this manner can provide a balance-to-unbalance conversion function for the SAW filter unit 201. Specifically, when a balanced electrical signal is input to the balanced signal terminals 210 and 211, an unbalanced electrical signal is output from the unbalanced signal terminal 209. On then other hand, when an unbalanced electrical signal is input to the unbalanced signal terminal 209, a balanced electrical signal is output from the balanced signal terminals 210 and 211.

The SAW resonators 202 and 203 are connected in series between the unbalanced signal terminal 209 and the IDTs 204 and 206 via a signal line 212. For simplicity of illustration, the number of electrode fingers shown in FIG. 1 is less than actually provided.

A ground line 221 is disposed between the signal line 212 and the balanced signal terminal 210, which carries a shield pattern for reducing the bridge capacitance therebetween.

In the SAW filter according to the first preferred embodiment, the IDTs 204, 205, and 206 are arranged so that the pitch between the IDTs 204 and 205, which are adjacent to each other in the SAW propagation direction, is different from the pitch between the IDTs 205 and 206, which are adjacent to each other in the SAW propagation direction. In other words, the SAW filter according to the first preferred embodiment has a horizontally asymmetrical structure with respect to an imaginary axis 222 that is positioned at the approximate center of the center IDT 205 in the SAW filter unit 201 in the SAW propagation direction and which is substantially perpendicular to the SAW propagation direction.

Where the wavelength defined by the pitch between the narrower-pitch electrode fingers is indicated by $\lambda I_2$ (indicated by the portions 213 and 214 in FIG. 1), and the wavelength defined by the pitch between the other electrode fingers is indicated by $\lambda I_1$, the specific design of the longitudinally coupled resonator SAW filter unit 201 is as follows:

interdigital length W: 60.6 $\lambda I_1$;
number of electrode fingers of the IDT 204: 29(4)
number of electrode fingers of the IDT 205: (4)45(4)
number of electrode fingers of the IDT 206: (4)29 (the number in parentheses indicates the number of narrower-pitch electrode fingers);
IDT wavelength
  $\lambda I_1$: 2.06 μm
  $\lambda I_2$: 1.88 μm;
reflector wavelength $\lambda R$: 2.07 μm;
number of electrode fingers of reflector: 100;
pitch between the IDTs 204 and 205: 0.500 $\lambda I_2$ (indicated by a portion 219 in FIG. 1)
pitch between the IDTs 205 and 206: 0.484 $\lambda I_2$ (indicated by a portion 220 in FIG. 1);
pitch between electrode finger having wavelength $\lambda I_1$ and electrode finger having
wavelength $\lambda I_2$ (indicated by portions 215, 216, 217, and 218 in FIG. 1): 0.250 $\lambda I_1$+0.250 $\lambda I_2$;
pitch between IDT and reflector: 0.470 $\lambda R$
duty: 0.60 (for IDT and reflector); and
electrode thickness: 0.080 $\lambda I_1$.

The specific design of the SAW resonator 202 is as follows:
interdigital length W: 49.1 $\lambda$;
number of electrode fingers of IDT: 401;

wavelength λ (for IDT and reflector): 2.04 μm;
number of electrode fingers of reflector: 30;
pitch between IDT and reflector: 0.50 λ;
duty: 0.60 (for IDT and reflector); and
electrode thickness: 0.080 λ.

The specific design of the SAW resonator 203 is as follows:
interdigital length W: 40.6 λ;
number of electrode fingers of IDT: 241;
wavelength λ (for IDT and reflector): 1.97 μm;
number of electrode fingers of reflector: 30;
pitch between IDT and reflector: 0.50 λ;
duty: 0.60 (for IDT and reflector); and
electrode thickness: 0.084 λ.

As used herein, "pitch" means the center-to-center distance between two electrode fingers in the width direction thereof.

Figure 2:
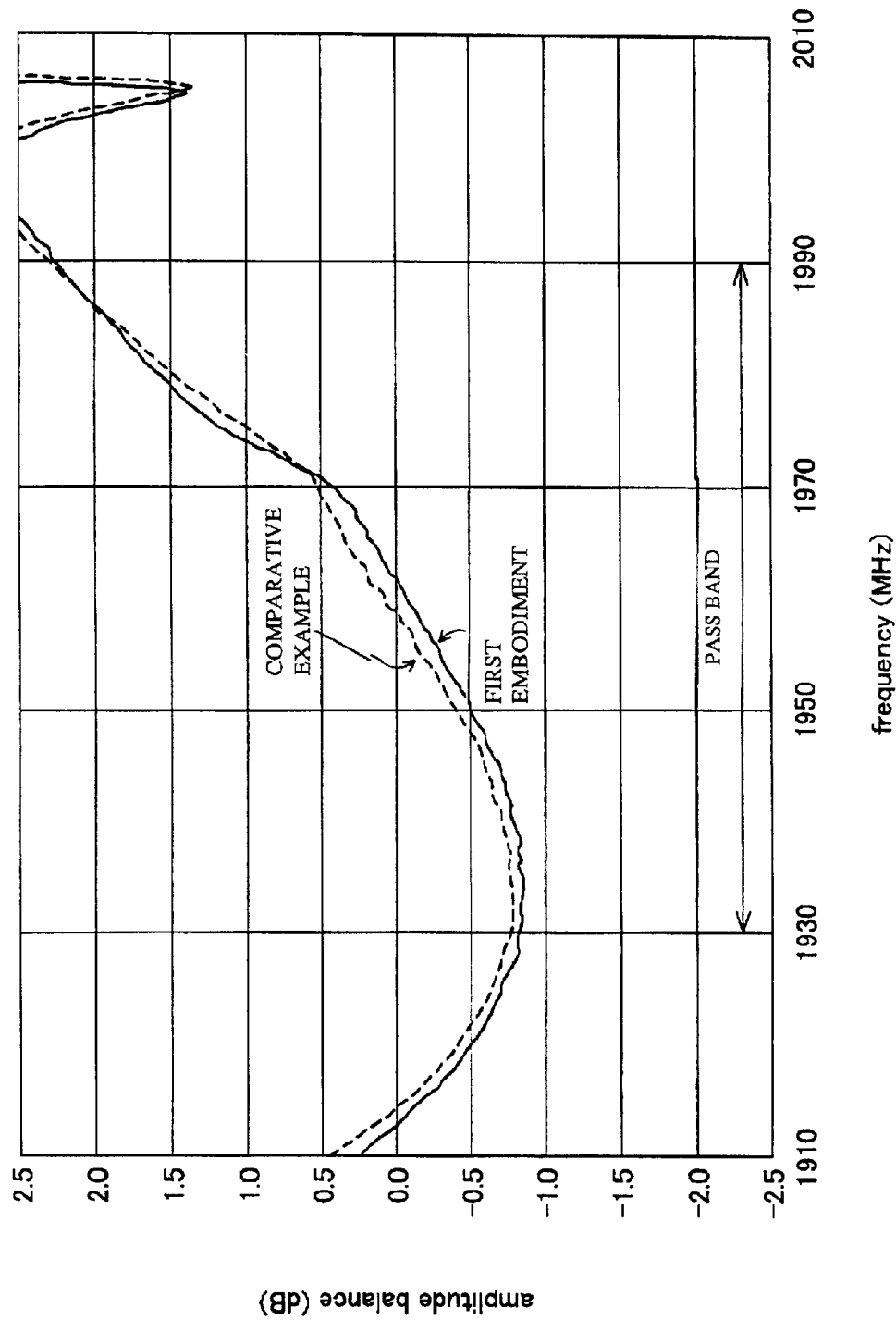
FIG. 2 is a graph showing the difference in amplitude balance between the first preferred embodiment and a comparative example.
Figure 3:
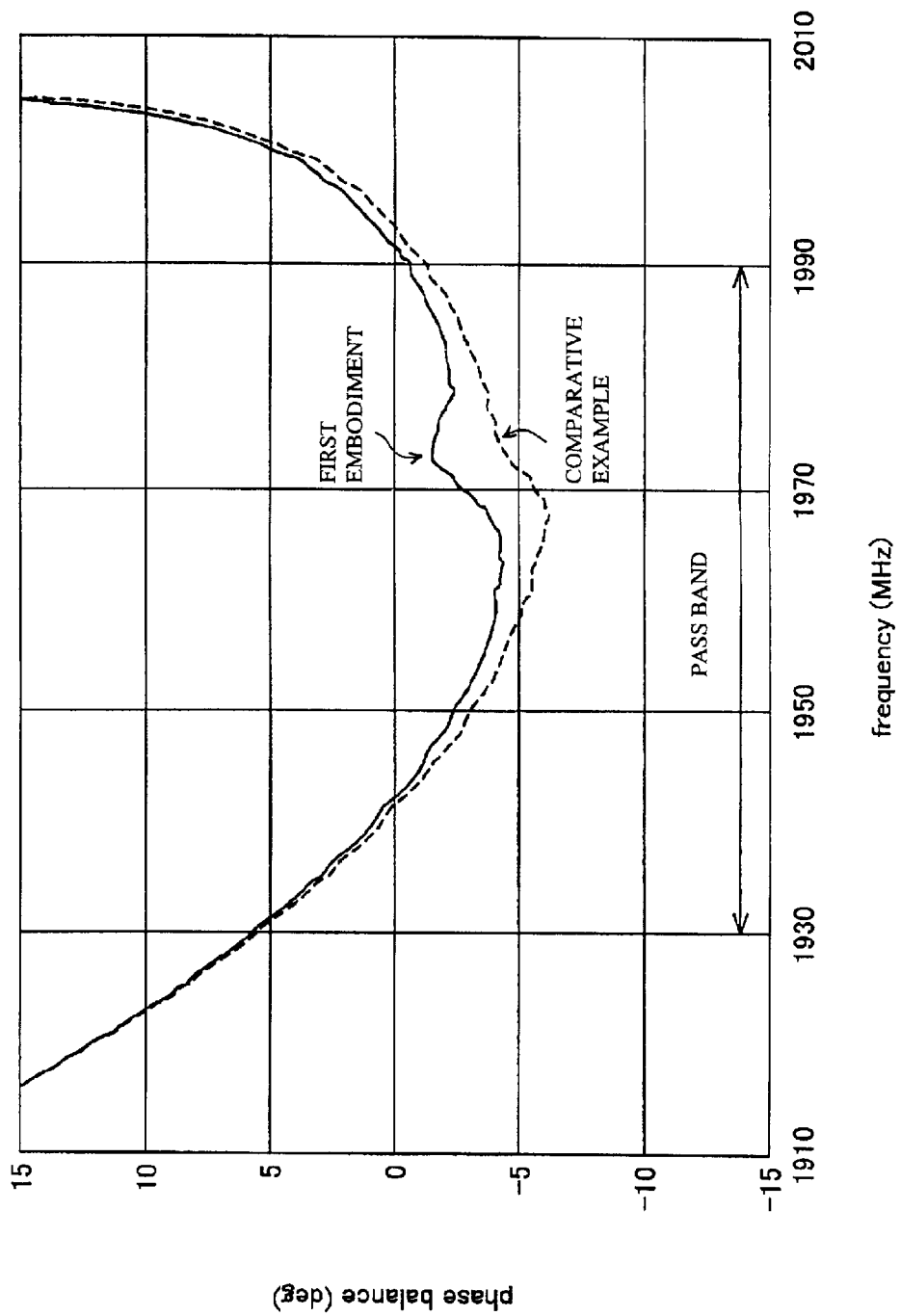
FIG. 3 is a graph showing the difference in phase balance between the first preferred embodiment and the comparative example.

FIGS. 2 and 3 are graphs showing the amplitude balance and the phase balance between the balanced signal terminals, respectively, in the frequency characteristic of the SAW filter according to the first preferred embodiment. A SAW filter in a comparative example shown in FIG. 4 includes a SAW filter unit 201a in which the pitch between the IDTs 204 and 205 is the same as the pitch between the IDTs 205 and 206. The amplitude balance and the phase balance of the SAW filter in the comparative example are also shown in FIGS. 2 and 3.

Figure 4:
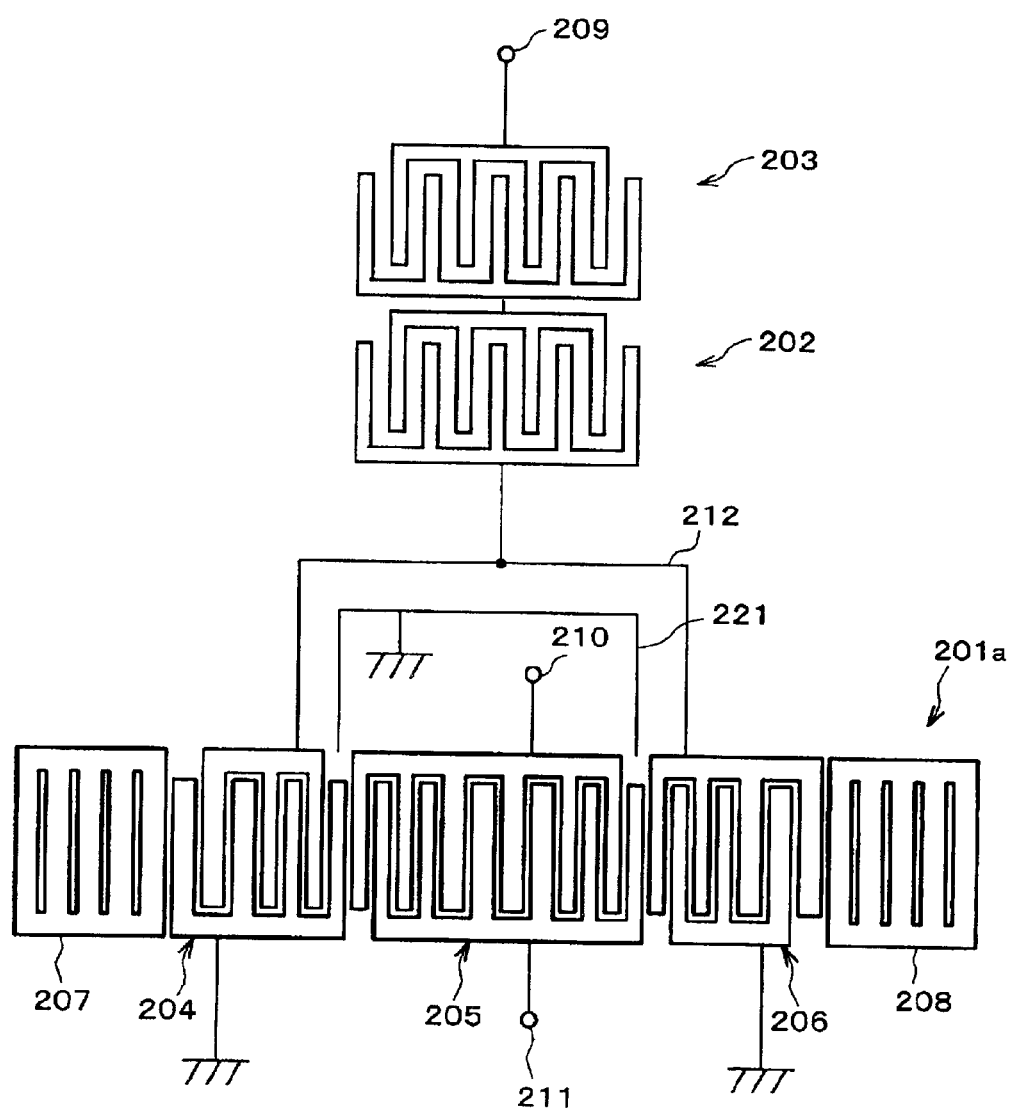
FIG. 4 is a schematic diagram of a SAW filter in the comparative example.

The SAW filter in the comparative example shown in FIG. 4 has the same structure as the SAW filter in the first preferred embodiment, except that the pitch between the IDTs 204 and 205 is the same as the pitch between the IDTs 205 and 206. Although not shown in FIG. 4, the piezoelectric substrate 20 is used in the SAW filter in the comparative example.

The frequency of the pass band of a PCS reception filter ranges from about 1930 MHz to about 1990 MHz. The amplitude balance in this frequency range is about −0.75 to about +2.30 dB (having a deviation of about 3.05 dB) for the comparative example, while it is about −0.80 to about +2.30 dB (having a deviation of about 3.10 dB) for the first preferred embodiment. The phase balance is −7.0 to +5.5° (having a deviation of 12.5°) for the comparative example, while it is about −4.0 to about +5.5° (having a deviation of about 9.5°) for the first preferred embodiment The smaller the deviation, the higher the amplitude balance, and the smaller the deviation, the higher the phase balance. In the first preferred embodiment, therefore, the amplitude balance is slightly lower, while the phase balance is about 3.0° higher.

Figure 5:
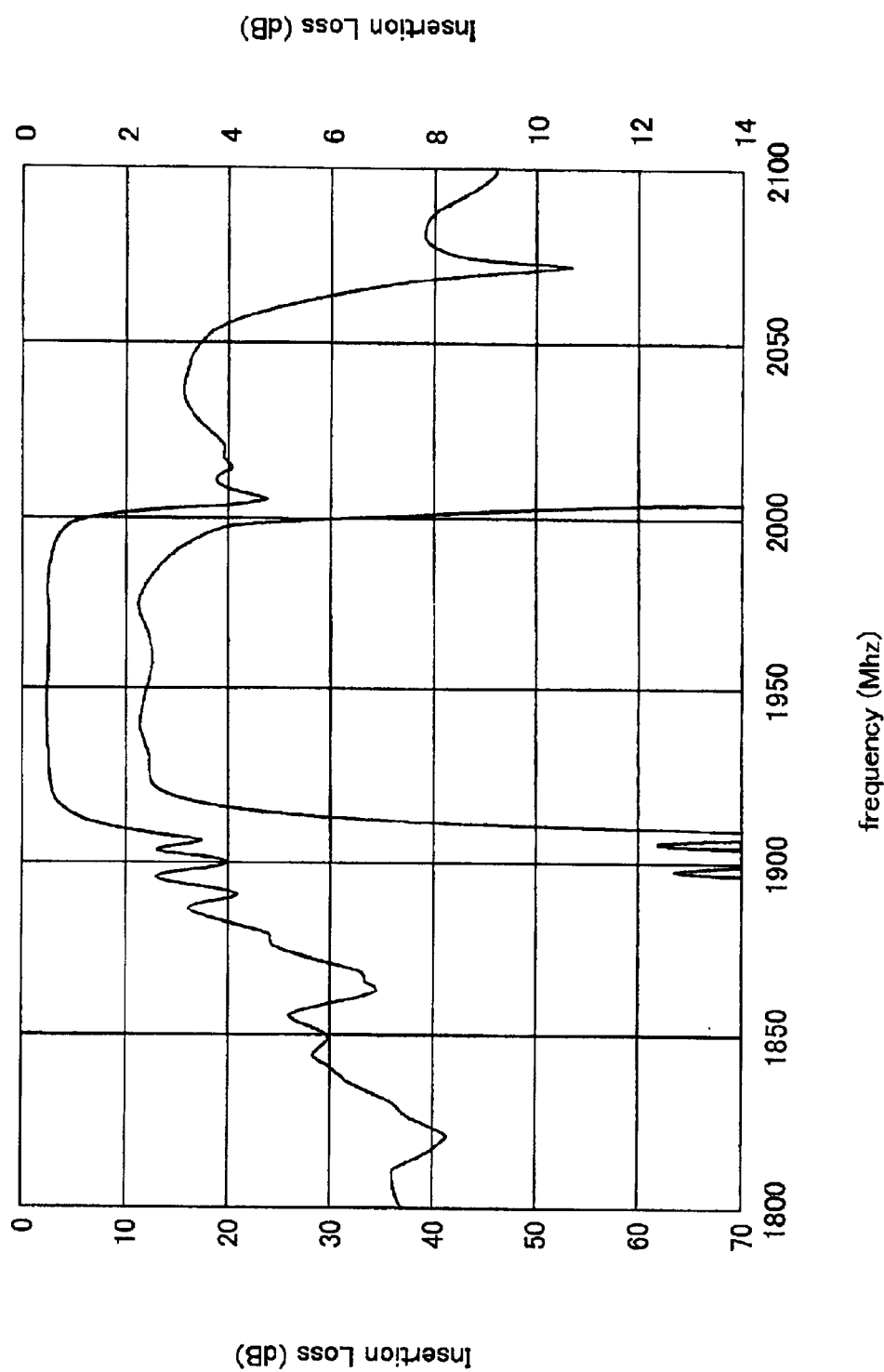
FIG. 5 is a graph showing the frequency-transmission characteristic of the SAW filter in the comparative example.
Figure 6:
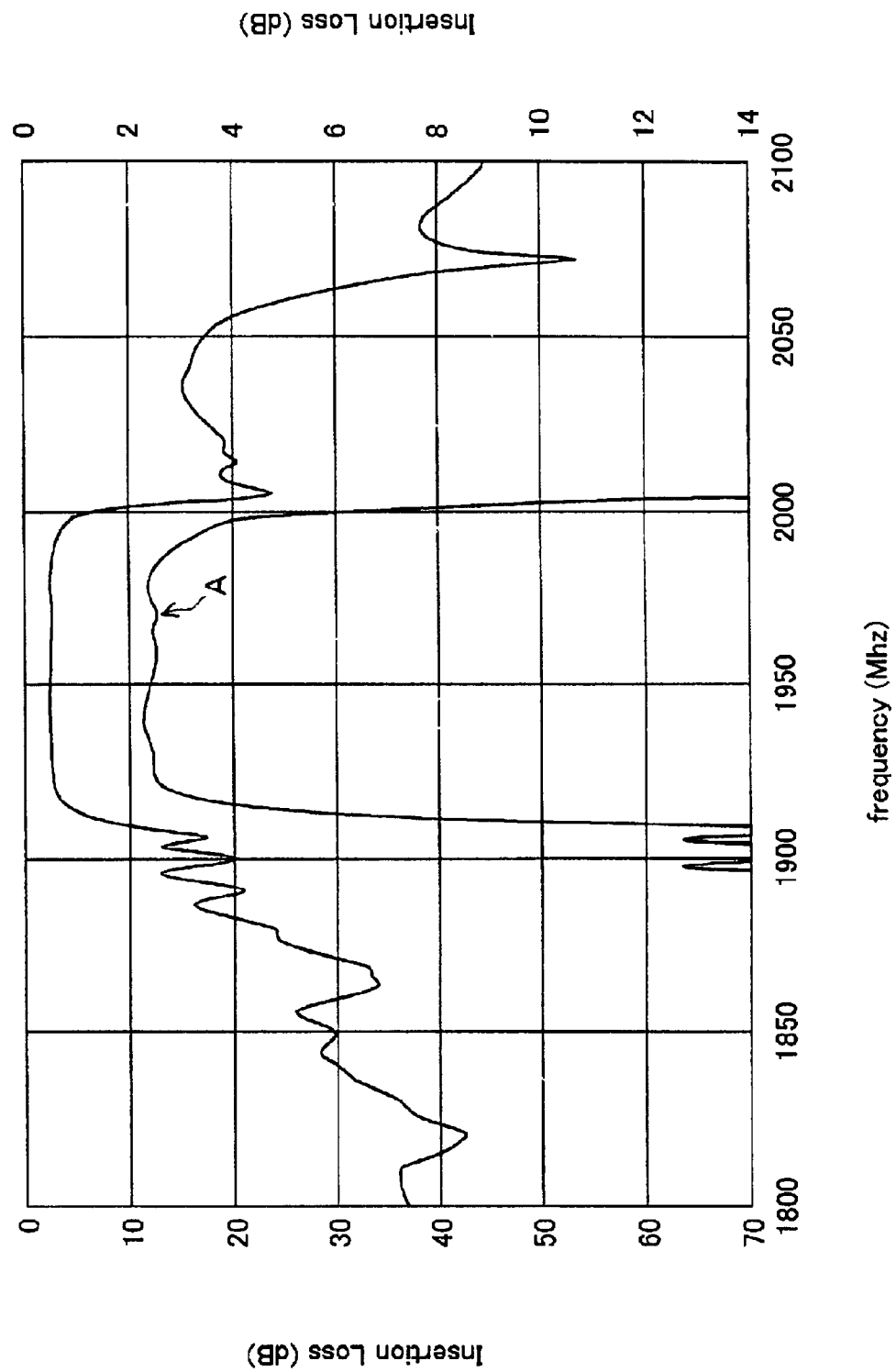
FIG. 6 is a graph showing the frequency-transmission characteristic of the SAW filter in the first preferred embodiment of the present invention.

This is an advantage achieved by making the pitch between the IDTs 204 and 205 different from the pitch between the IDTs 205 and 206 to compensate for a difference between the total capacitance of the electrode fingers connected to the balanced signal terminal 210 and the total capacitance of the electrode fingers connected to the balanced signal terminal 211, and for a difference in conversion efficiency between an electrical signal and a surface acoustic wave between the balanced signal terminals 210 and 211. FIGS. 5 and 6 show the transmission characteristics of the SAW filter in the comparative example and the SAW filter in the first preferred embodiment, respectively. The transmission characteristic for the first preferred embodiment is substantially the same as that for the comparative example, although the transmission characteristic for the first preferred embodiment exhibits a small undesirable ripple A in the pass band, as shown in FIG. 6.

If the pitches between IDTs on the left and right sides of the SAW filter unit 201 greatly differ, a large undesirable ripple A is exhibited in the pass band. Therefore, the pitches between IDTs should be adjusted so that the undesirable ripple is not large and, preferably, the ripple does not exceed 1.0 dB, which is a commercial requirement of the deviation in the pass band, in order to achieve the advantages of the first preferred embodiment of the present invention.

According to the first preferred embodiment, therefore, the SAW filter having a balance-to-unbalance conversion function is configured so that the pitches between IDTs on the left and right sides are different so as to provide a horizontally asymmetrical structure with respect to the imaginary axis 222 that is positioned at the approximate center of the center IDT 205 of the SAW filter unit 201 and which is substantially perpendicular to the SAW propagation direction. Consequently, the SAW filter according to the first preferred embodiment can have a higher phase balance between balanced signal terminals than the SAW filter in the comparative example.

In the first preferred embodiment, a single longitudinally coupled resonator SAW filter unit 201 having three IDTs 204, 205, and 206 is used, and two SAW resonators 202 and 203 are connected in series to the SAW filter unit 201, in which a balanced signal is obtained from the center IDT 205 of the longitudinally coupled resonator SAW filter unit 201. However, the present invention is not limited to this form, and a SAW filter having balanced signal terminals of any configuration can achieve advantages similar to those of the first preferred embodiment of the present invention.

Figure 7:
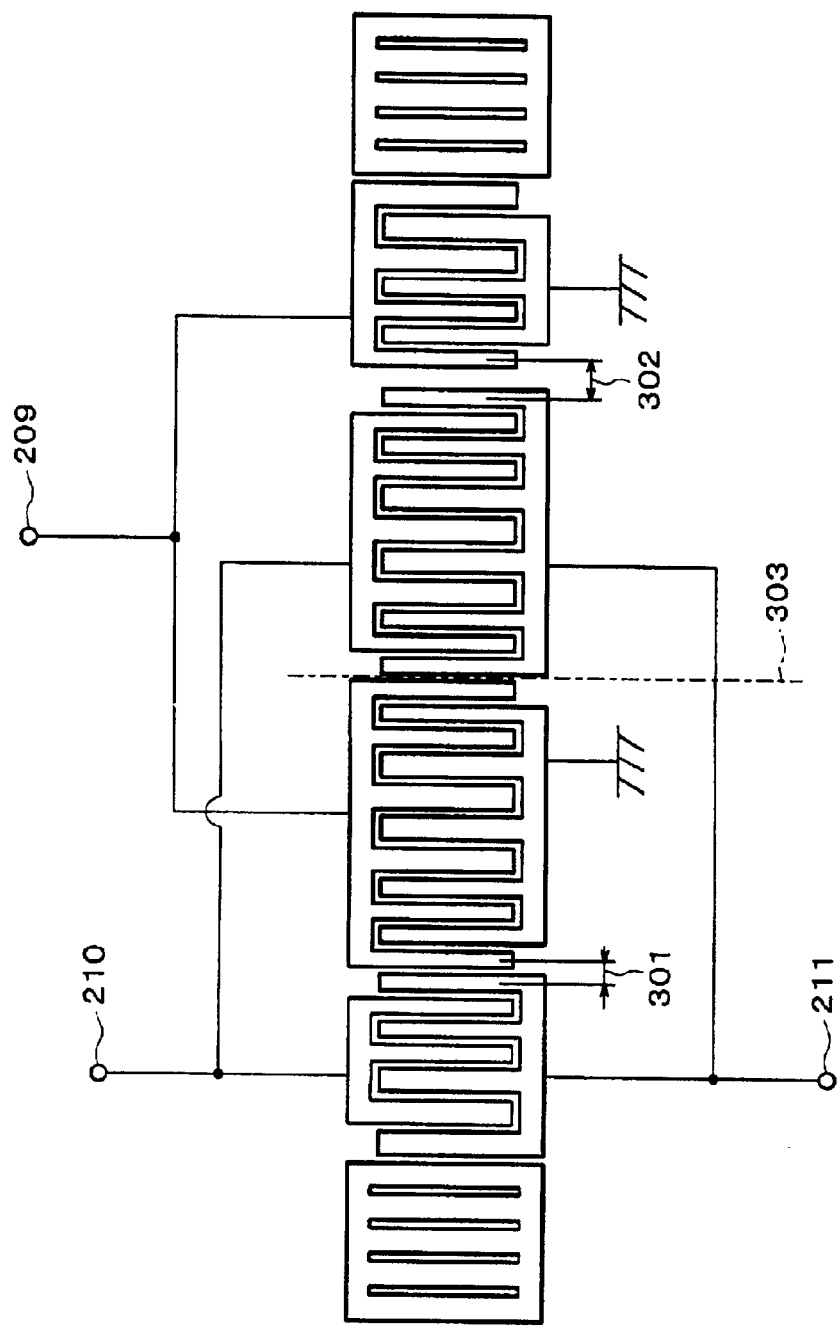
FIG. 7 is a schematic diagram of a modification of the SAW filter in the first preferred embodiment of the present invention.

For example, in a longitudinally coupled resonator SAW filter having four IDTs, as shown in FIG. 7, a pitch 301 between adjacent IDTs is different from a pitch 302 between adjacent IDTs so as to provide a horizontally asymmetrical structure with respect to an imaginary axis 303 that is portioned at the approximate center of the SAW filter unit and which is substantially perpendicular to the SAW propagation direction. With the horizontally asymmetrical structure, advantages similar to those in the first preferred embodiment can achieved.

Figure 8:
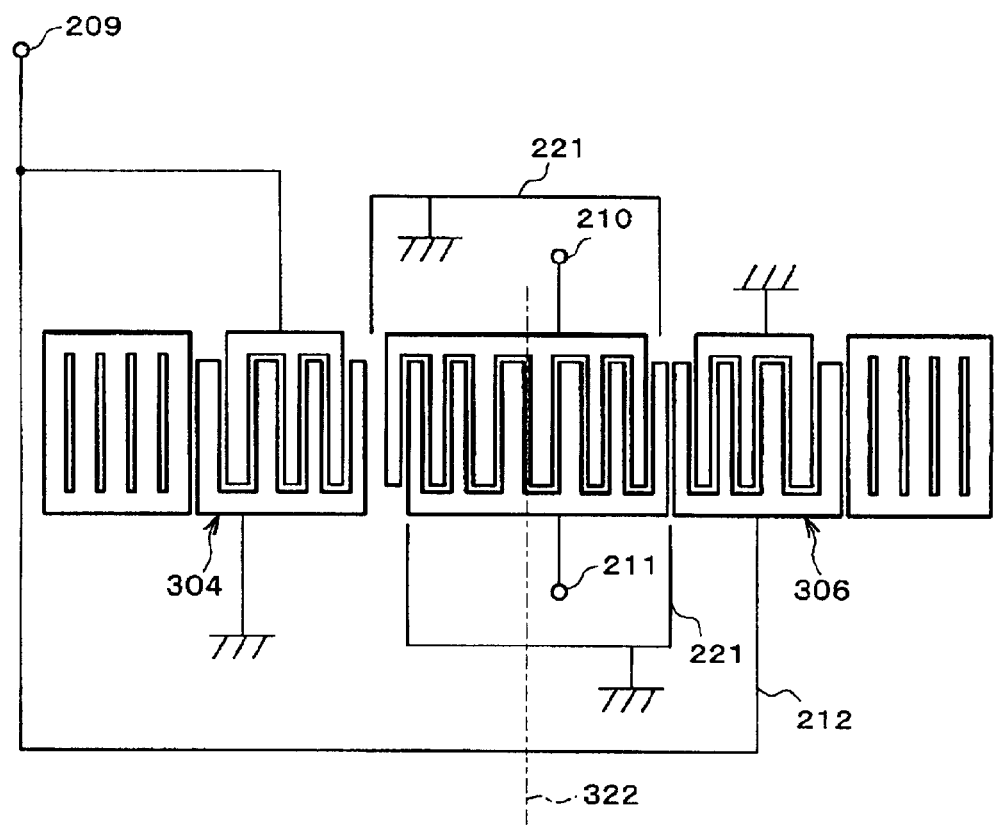
FIG. 8 is a schematic diagram of another modification of the SAW filter in the first preferred embodiment of the present invention.

It is apparent that advantages similar to those of the first preferred embodiment are achieved by a SAW filter having more IDTs. For example, a SAW filter having a SAW resonator connected in parallel to the SAW filter unit 201 may be used. As shown in FIG. 8, a SAW filter may be configured such that the unbalanced signal terminal 209 is input (output) from the opposite sides of IDTs 304 and 306 of the longitudinally coupled resonator SAW filter unit. A SAW filter having two longitudinally coupled resonator SAW filter units connected in a cascade manner may be used. These SAW filters would achieve advantages similar to those of the first preferred embodiment if, for example, in FIG. 8, the SAW filter has a horizontally asymmetrical structure with respect to an imaginary axis 322.

In the SAW filter according to the first preferred embodiment, the piezoelectric substrate 20 is preferably a 40±5° Y-cut X-propagating $LiTaO_3$ substrate. However, the present invention is not limited thereto, as anticipated from the principle that the advantages of preferred embodiments of the present invention are achieved. The piezoelectric substrate 20 may be made of 64° to 72° Y-cut X-propagating $LiNbO_3$, 41° Y-cut X-propagating $LiNbO_3$, or other suitable material.

Figure 9:
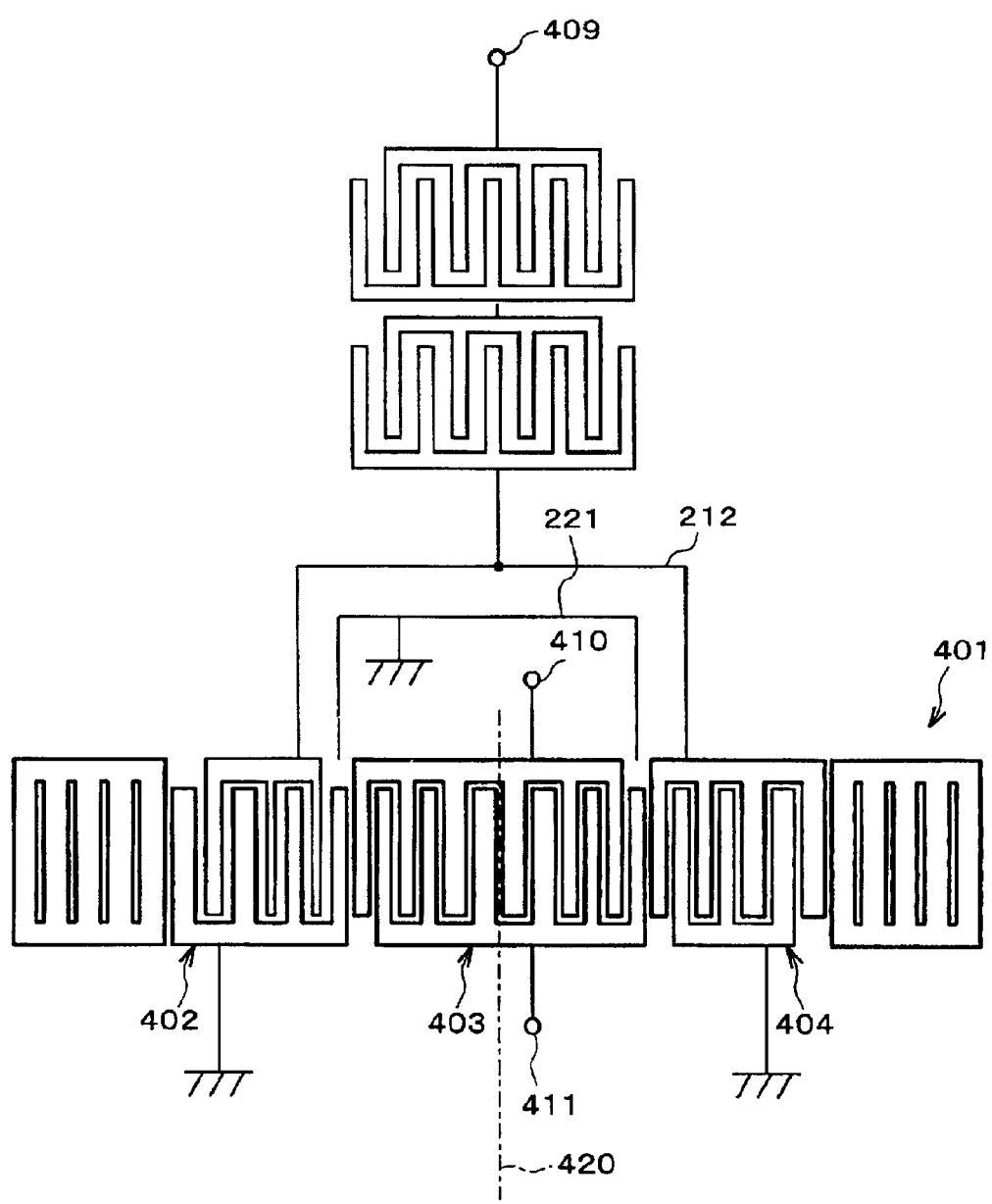
FIG. 9 is a schematic diagram of a SAW filter according to a second preferred embodiment of the present invention.

FIG. 9 shows a SAW filter according to a second preferred embodiment of the present invention. The SAW filter according to the second preferred embodiment is different from that in the comparative example shown in FIG. 4 in that the duty of the electrode fingers of the IDT 402 that are connected to the unbalanced signal terminal 409 is changed from about 0.60 to about 0.50. Given that an imaginary axis 420 is positioned at the approximate center of the center IDT 403 of a SAW filter unit 401, and is substantially perpendicular to the SAW propagation direction, the SAW filter unit 401 has a horizontally asymmetrical structure with respective to the imaginary axis 420. The structure of the other components is the same as that of the comparative example.

Figure 10:
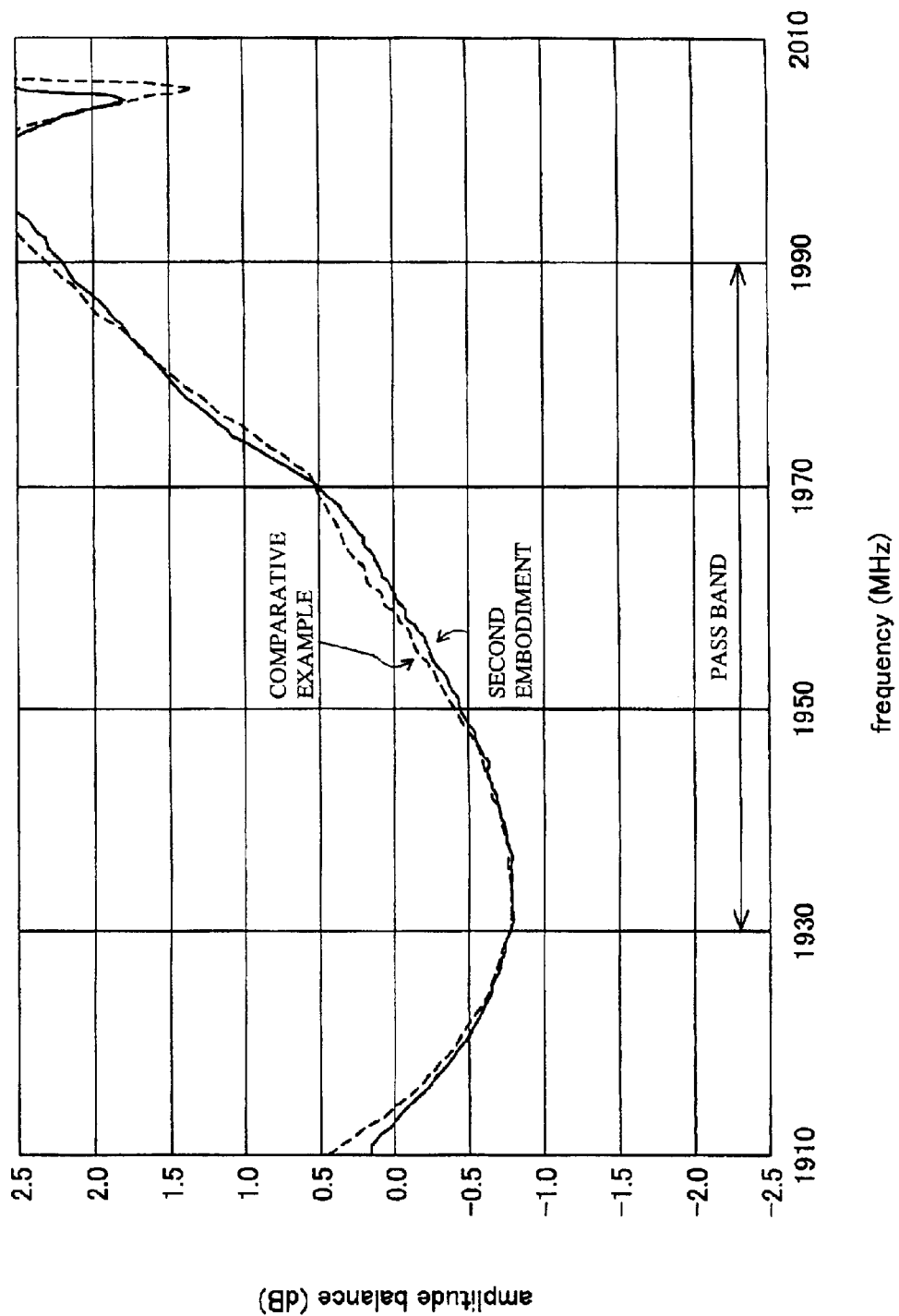
FIG. 10 is a graph showing the difference in amplitude balance between the second preferred embodiment and the comparative example.
Figure 11:
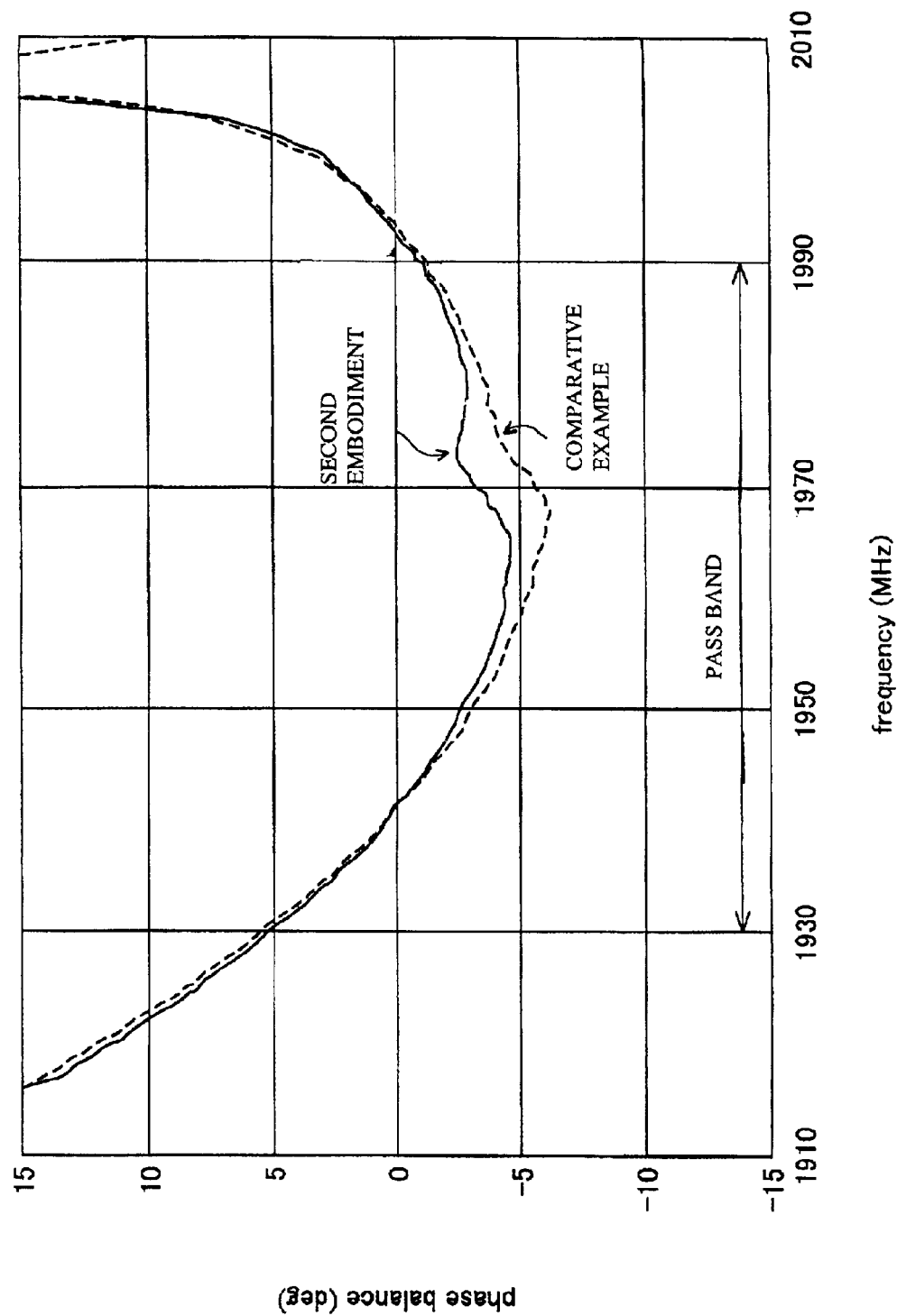
FIG. 11 is a graph showing the difference in phase balance between the second preferred embodiment and the comparative example.

FIGS. 10 and 11 are graphs showing the amplitude balance and the phase balance between balanced signal terminals 410 and 411, respectively, in the frequency characteristic of the SAW filter according to the second preferred embodiment For comparison, the amplitude balance and the phase balance of the SAW filter in the comparative example shown in FIG. 4 are also shown in FIGS. 10 and 11, respectively.

In the SAW filter in the second preferred embodiment, the duty of the electrode fingers of the IDT 402 that are connected to the unbalanced signal terminal 409 is changed, thus making the bandpass frequency band about 1 MHz higher than that of the SAW filter in the comparative example.

For simplification of comparison between the second preferred embodiment and the comparative example, in FIGS. 10 and 11, the frequency of the SAW filter in the second preferred embodiment is 1 MHz lower than actually provided. The amplitude balance in the frequency range of the pass band of a PCS reception filter is about −0.75 dB to about +2.30 dB (having a deviation of about 3.05 dB) for the comparative example, while it is about −0.75 dB to about +2.25 dB (having a deviation of about 3.00 dB) for the second preferred embodiment. In the second preferred embodiment, therefore, the amplitude balance is about 0.05 dB higher.

Figure 12:
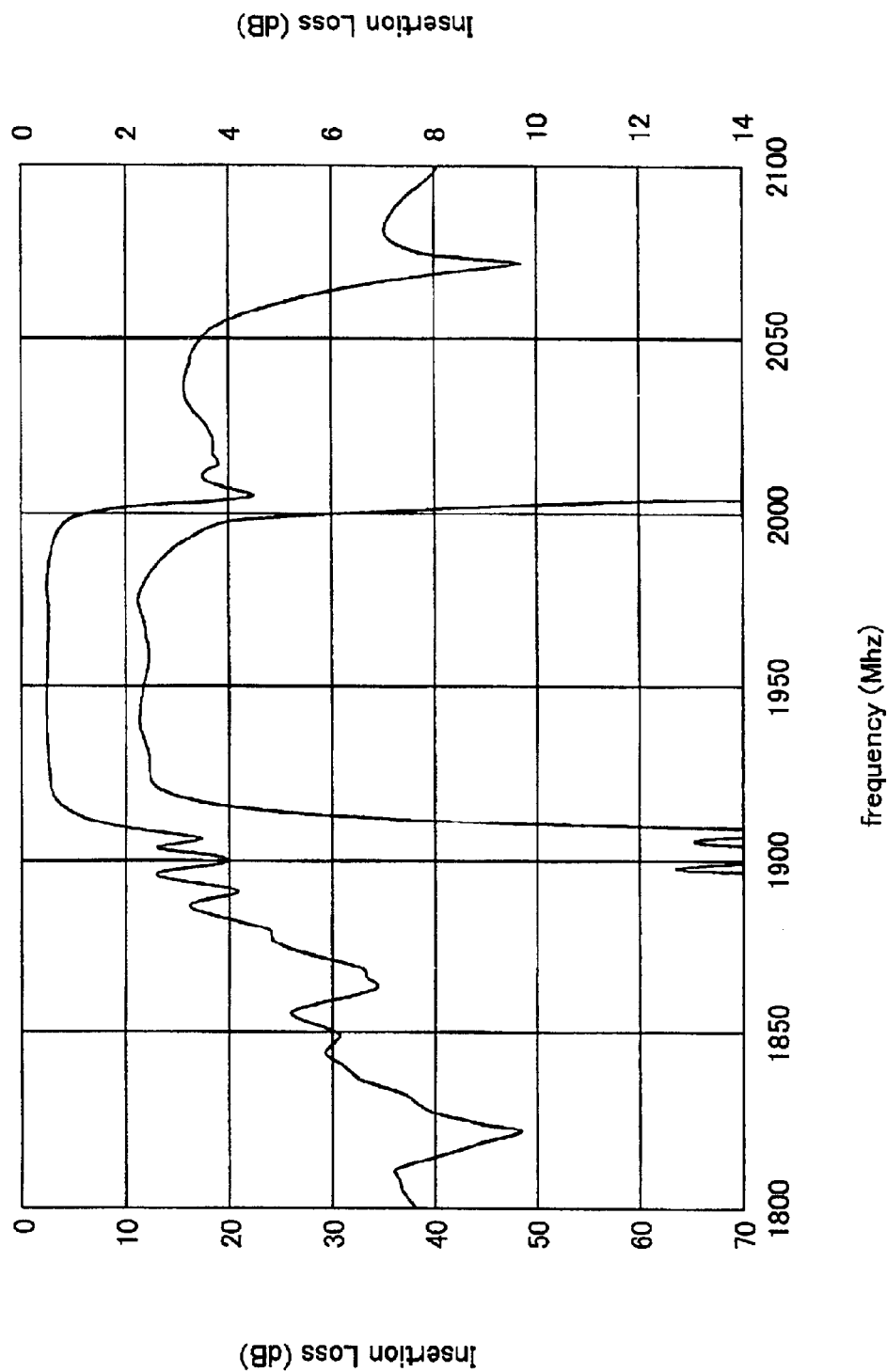
FIG. 12 is a graph showing the frequency-transmission characteristic of the SAW filter in the second preferred embodiment of the present invention.

The phase balance in the frequency range is −7.0° to +5.5° (having a deviation of 12.5°) for the comparative example, while it is −4.5° to about +5.0° (having a deviation of about 9.5°) for the second preferred embodiment. In the second preferred embodiment, therefore, the phase balance is about 3.0° higher. This is an advantage achieved by reducing the duty of the electrode fingers of the IDT 402 that are connected to the unbalanced signal terminal 409 to compensate for a difference between the total capacitance of the electrode fingers connected to the balanced signal terminal 410 and the total capacitance of the electrode fingers connected to the balanced signal terminal 411, and for a difference in conversion efficiency between an electrical signal and a surface acoustic wave between the balanced signal terminals 410 and 411. The SAW filter in the second preferred embodiment exhibits substantially the same transmission characteristic in the pass band as the SAW filter in the comparative example, as is apparent from FIG. 5 showing the transmission characteristic for the comparative example and FIG. 12 showing the transmission characteristic for the second preferred embodiment of the present invention.

According to the second preferred embodiment, therefore, the SAW filter having a balance-to-unbalance conversion function is configured so that the duty of the electrode fingers of the IDT 402 that are connected to the unbalanced signal terminal 409 is reduced so as to provide a horizontally asymmetrical structure with respect to the imaginary axis 420 that is positioned at the center of the center IDT 403 of the SAW filter unit 401 and which is substantially perpendicular to the SAW propagation direction. Consequently, the SAW filter according to the second preferred embodiment can have higher balance between the balanced signal terminals 410 and 411 than the SAW filter in the comparative example.

In the second preferred embodiment, only the duty of a signal electrode is changed. However, the duty of either a signal electrode or a ground electrode may be changed to provide a horizontally asymmetrical structure, thereby achieving advantages similar to those of the second preferred embodiment. Furthermore, while the duty is reduced in the second preferred embodiment, the duty of, for example, the IDT 404 may be increased, thereby providing higher balance. The duty may be increased or reduced depending upon IDTs.

Figure 13:
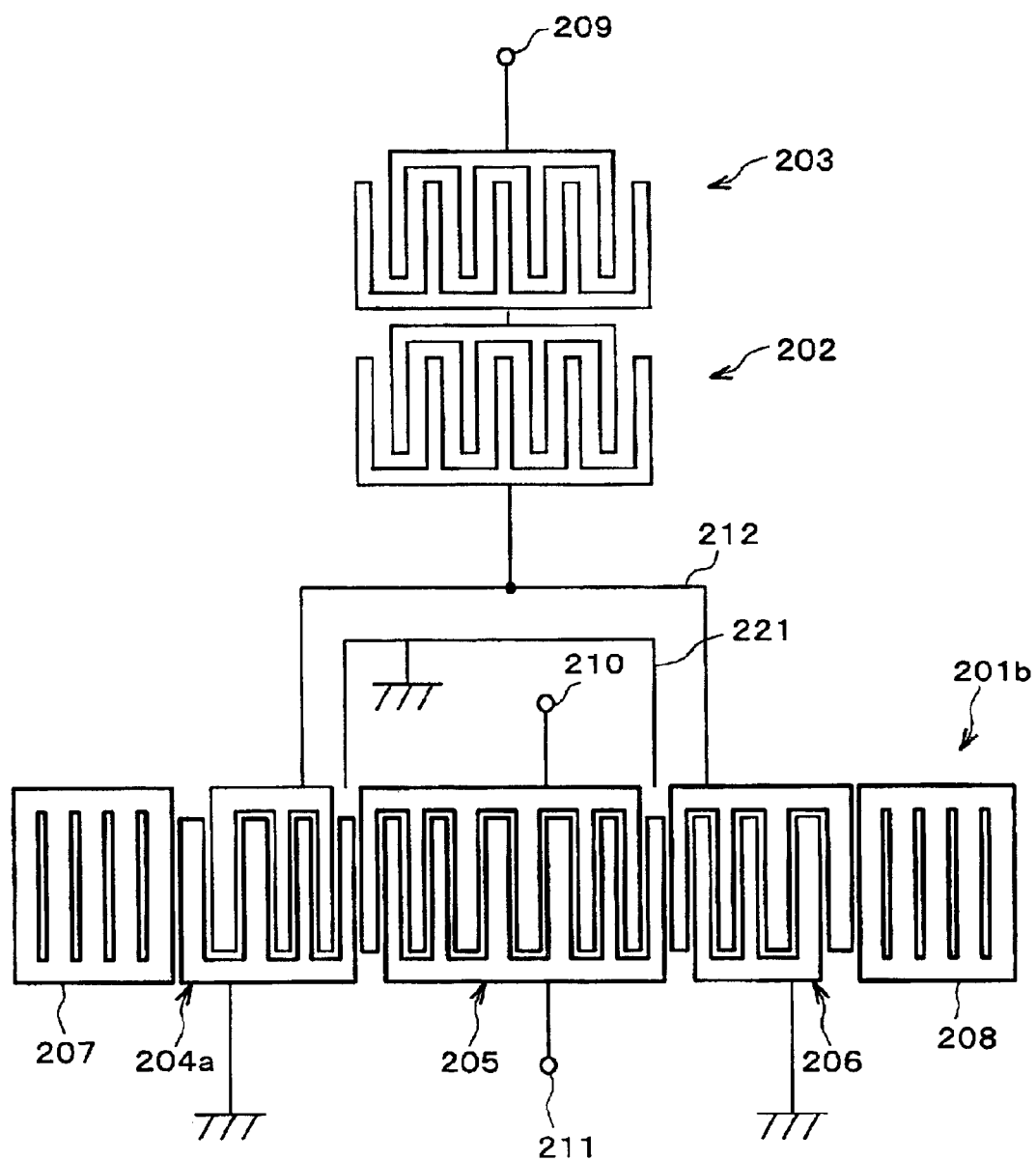
FIG. 13 is a schematic diagram of a SAW filter according to a third preferred embodiment of the present invention.

A SAW filter according to a third preferred embodiment of the present invention is now described with reference to FIG. 13. The SAW filter according to the third preferred embodiment is the same as the SAW filter in the comparative example shown in FIG. 4, except that a SAW filter unit 201*b* having an IDT 204*a* with a pitch that is about 0.01 μm smaller than the pitch of the IDT 204 in FIG. 4. Thus, the SAW filter unit 201*b* has a horizontally asymmetrical structure with respective to an imaginary axis that is positioned at the approximate center of the center IDT 205 of the SAW filter unit 201*b* and which is substantially perpendicular to the SAW propagation direction.

Figure 14:
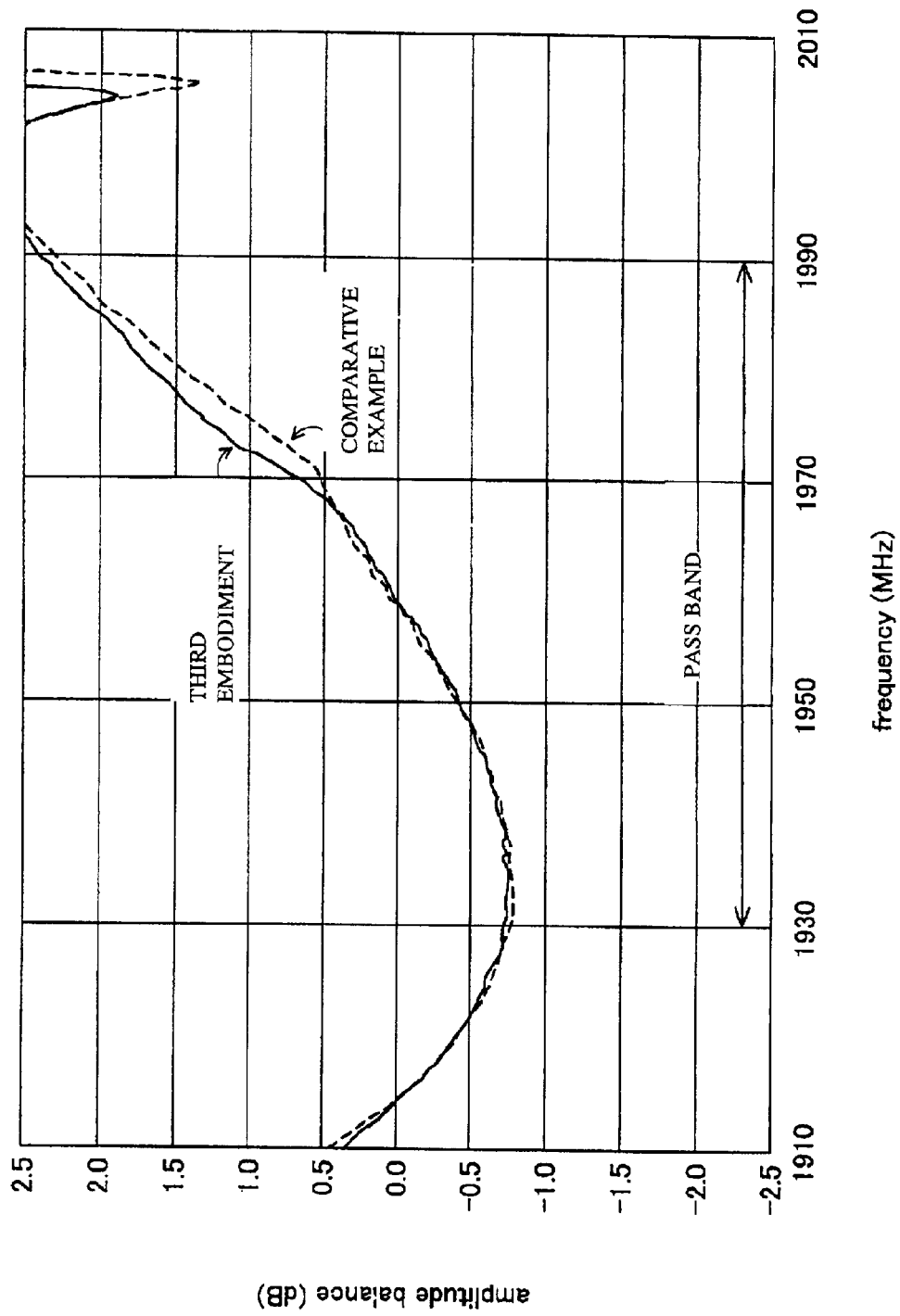
FIG. 14 is a graph showing the difference in amplitude balance between the third preferred embodiment and the comparative example.
Figure 15:
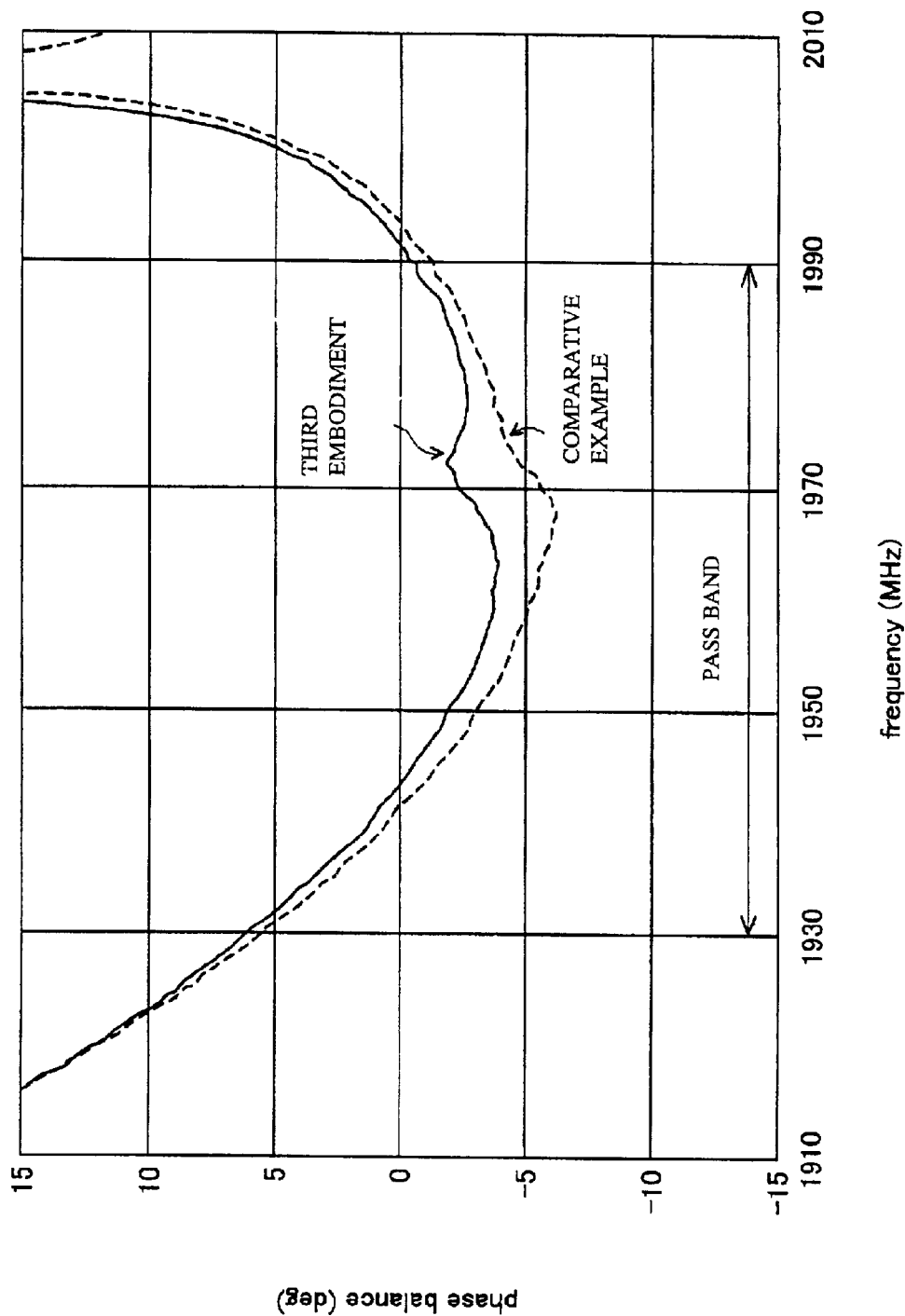
FIG. 15 is a graph showing the difference in phase balance between the third preferred embodiment and the comparative example.

FIGS. 14 and 15 are graphs showing the amplitude balance and the phase balance between balanced signal terminals, respectively, in the frequency characteristic of the SAW filter according to the third preferred embodiment. For comparison, the amplitude balance and the phase balance of the SAW filter in the comparative example shown in FIG. 4 are also shown in FIGS. 14 and 15, respectively.

In the third preferred embodiment, the IDT 204*a* has a pitch that is about 0.01 μm smaller than the pitch of the IDT 204 in FIG. 4, thus making the bandpass frequency about 1 MHz higher than that of the SAW filter in the comparative example. For simplification of comparison between the third preferred embodiment and the comparative example, in FIGS. 14 and 15, the frequency of the SAW filter in the third preferred embodiment is about 1 MHz lower than actually provided.

The amplitude balance in the frequency range of the pass band of a PCS reception SAW filter is −0.75 dB to +2.30 dB (having a deviation of 3.05 dB) for the comparative example, while it is about −0.75 dB to about +2.40 dB (having a deviation of about 3.15 dB) for the third preferred embodiment. The phase balance is −7.0° to +5.5° (having a deviation of 12.5°) for the comparative example, while it is about −3.5° to about +6.0° (having a deviation of about 9.5°) for the third preferred embodiment. In the third preferred embodiment, therefore, the amplitude balance is slightly lower, although the phase balance is about 3.0° higher.

This is an advantage achieved by using the IDT 204*a* having a pitch is smaller than that of the IDT 204 to compensate for a difference between the total capacitance of the electrode fingers connected to the balanced signal terminal 210 and the total capacitance of the electrode fingers connected to the balanced signal terminal 211, and for a difference in conversion efficiency between an electrical signal and a surface acoustic wave between the balanced signal terminals 210 and 211.

Figure 16:
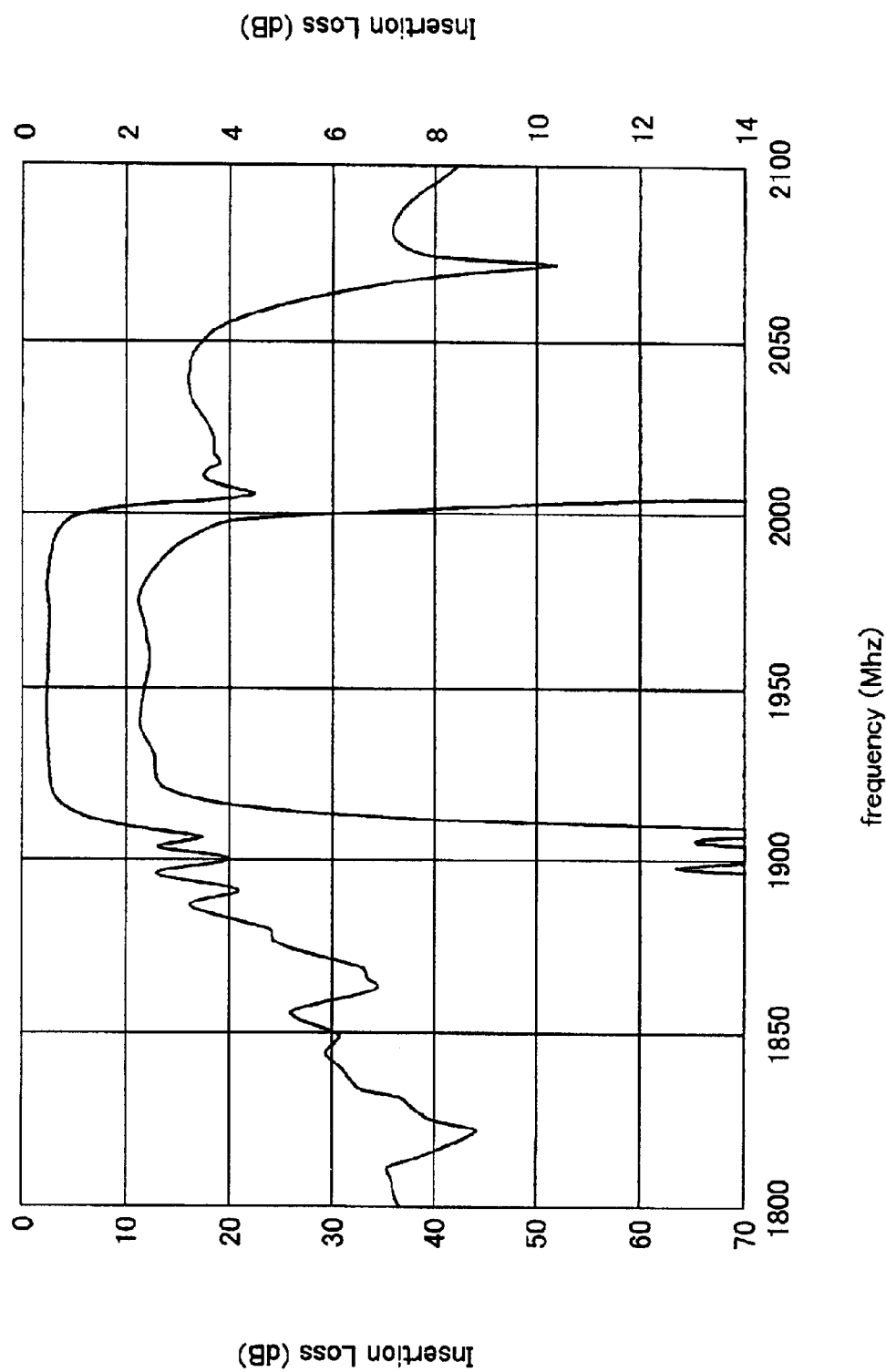
FIG. 16 is a graph showing the frequency-transmission characteristic of the SAW filter in the third preferred embodiment of the present invention.

The SAW filter in the third preferred embodiment exhibits substantially the same transmission characteristic in the pass band as the SAW filter in the comparative example, although the pass bandwidth is slightly narrower than that in the comparative example, as is apparent from FIG. 5 showing the transmission characteristic for the comparative example and FIG. 16 showing the transmission characteristic for the third preferred embodiment of the present invention.

According to the third preferred embodiment, therefore, the SAW filter having a balance-to-unbalance conversion function is configured so that the IDT 204a having a pitch that is smaller than the pitch of the IDT 204 in the comparative example is used so as to provide a horizontally asymmetrical structure with respect to an imaginary axis that is positioned at the approximate center of the center IDT 205 of the SAW filter unit 201b and which is substantially perpendicular to the SAW propagation direction. Consequently, the SAW filter according to the third preferred embodiment can have a higher phase balance between the balanced signal terminals 210 and 211 than the SAW filter in the comparative example.

While the pitch is reduced in the third preferred embodiment, the pitch of, for example, the IDT 206 may be increased, thereby providing higher balance. The pitch may be increased or reduced depending upon IDTs.

Figure 17:
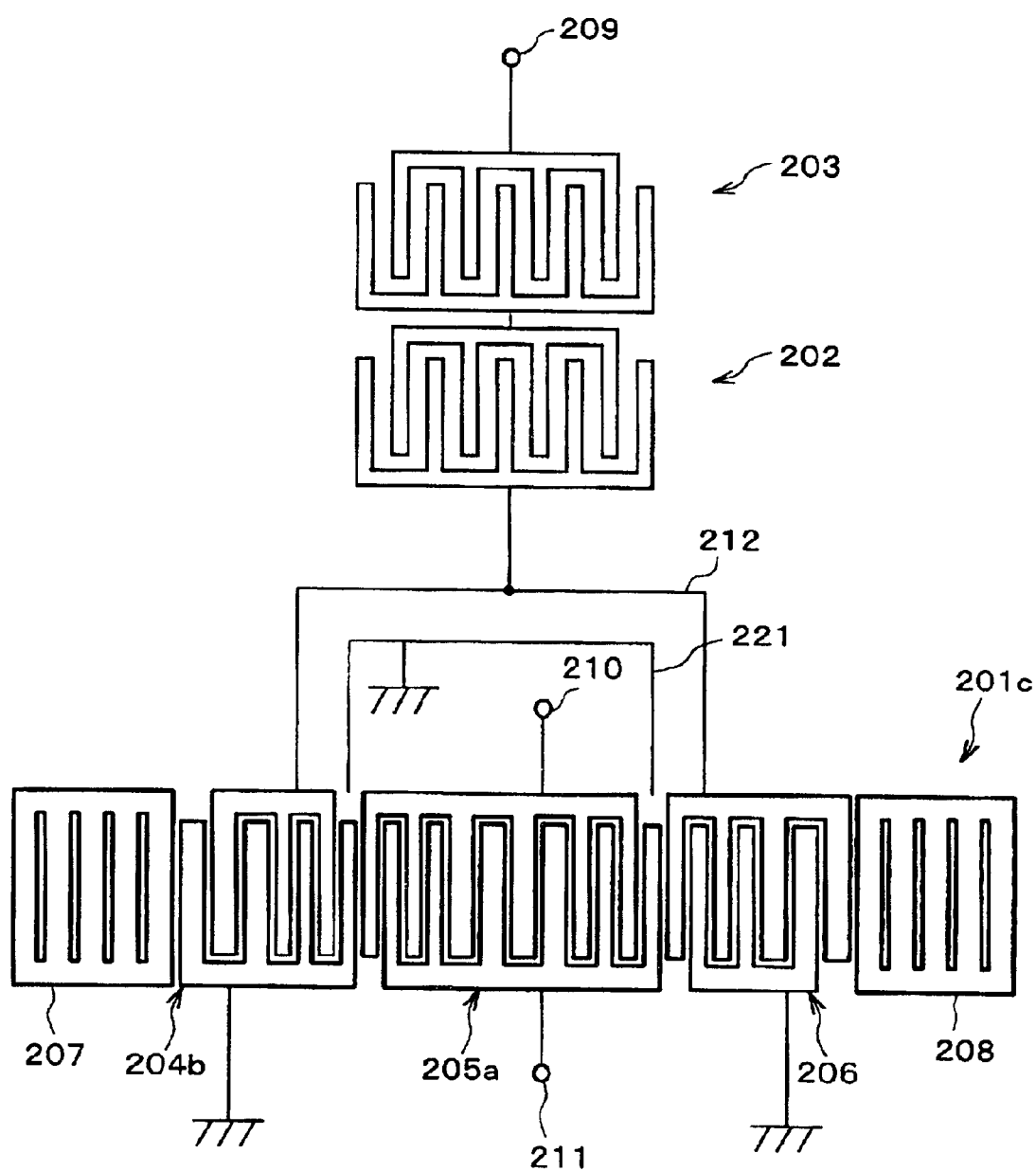
FIG. 17 is a schematic diagram of a modification of the SAW filter in the third preferred embodiment of the present invention.

Furthermore, the pitch between narrower-pitch electrode fingers near the portion where the IDTs 204 and 205 are adjacent to each other may be different from the pitch between narrower-pitch electrode fingers near the portion where the IDTs 205 and 206 are adjacent to each other, as shown in FIG. 17. For example, the SAW filter shown in FIG. 17 is the same as the SAW filter in the comparative example shown in FIG. 4, except that it uses a SAW filter unit 201c having an IDT 204b in which the pitch between narrower-pitch electrode fingers is smaller than the pitch between narrower-pitch electrode fingers in the IDT 204 shown in FIG. 4, and an IDT 205a in which the pitch between narrower-pitch electrode fingers near the IDT 204b is smaller than the pitch between narrower-pitch electrode fingers in the IDT 205 near the IDT 204 shown in FIG. 4.

Accordingly, in the configuration shown in FIG. 17, the pitch between electrode fingers near the portion where the IDT 205a is adjacent to the IDT 204b and the pitch between electrode fingers near the portion where the IDT 205a is adjacent to the IDT 206 are horizontally asymmetric with respect to an imaginary axis that is positioned at the approximate center of the center IDT 205a of the SAW filter unit 201c and which is substantially perpendicular to the SAW propagation direction. Consequently, the SAW filter can have higher balance between the balanced signal terminals 210 and 211 than the SAW filter in the comparative example.

In a SAW filter according to preferred embodiments of the present invention, therefore, on a piezoelectric substrate, a plurality of IDTs are arranged along the SAW propagation direction, and balanced signal input terminals or balanced signal output terminals are provided. The surface acoustic wave filter does not have an electrically neutral point, and therefore is a floating balanced type. The surface acoustic wave filter has a horizontally asymmetrical structure with respect to an imaginary axis that is positioned at the approximate center IDT of the SAW filter and which is substantially perpendicular to the SAW propagation direction. With the horizontally asymmetrical structure, the SAW filter can have higher balance (the phase balance, in particular) between the balanced signal terminals.

In a preferable form, the SAW filter has an odd number of IDTs, and has a horizontally asymmetrical structure with respect to an imaginary axis that is positioned at the approximate center of the center IDT of the IDTs and which is substantially perpendicular to the SAW propagation direction.

Preferable configurations or methods to provide a horizontally asymmetrical structure are as follows:

(1) the distances between adjacent IDTs in the SAW filter are horizontally asymmetric with respect to the imaginary axis that is substantially perpendicular to the SAW propagation direction;

(2) the duties of a plurality of IDTs in the SAW filter are horizontally asymmetric with respect to the imaginary axis that is substantially perpendicular to the SAW propagation direction;

(3) the pitches of a plurality of IDTs in the SAW filter are horizontally asymmetric with respect to the imaginary axis that is substantially perpendicular to the SAW propagation direction; and (4) the SAW filter includes narrower-pitch electrode finger portions in which the pitch between several electrode fingers is smaller than the pitch between the other electrode fingers at the portion where two IDTs are adjacent to each other, wherein the pitches of the narrower-pitch electrode finger portions are horizontally asymmetric with respect to the imaginary axis that is substantially perpendicular to the SAW propagation direction.

The SAW filter according to preferred embodiments of the present invention preferably includes at least one SAW resonator connected in series or in parallel or in combination thereof in order to increase the out-of-passband attenuation.

Although the features of the first to third preferred embodiments have been separately illustrated, by way of example, in the foregoing description, it is apparent to achieve advantages similar to those of various preferred embodiments using any combination thereof.

Figure 18:
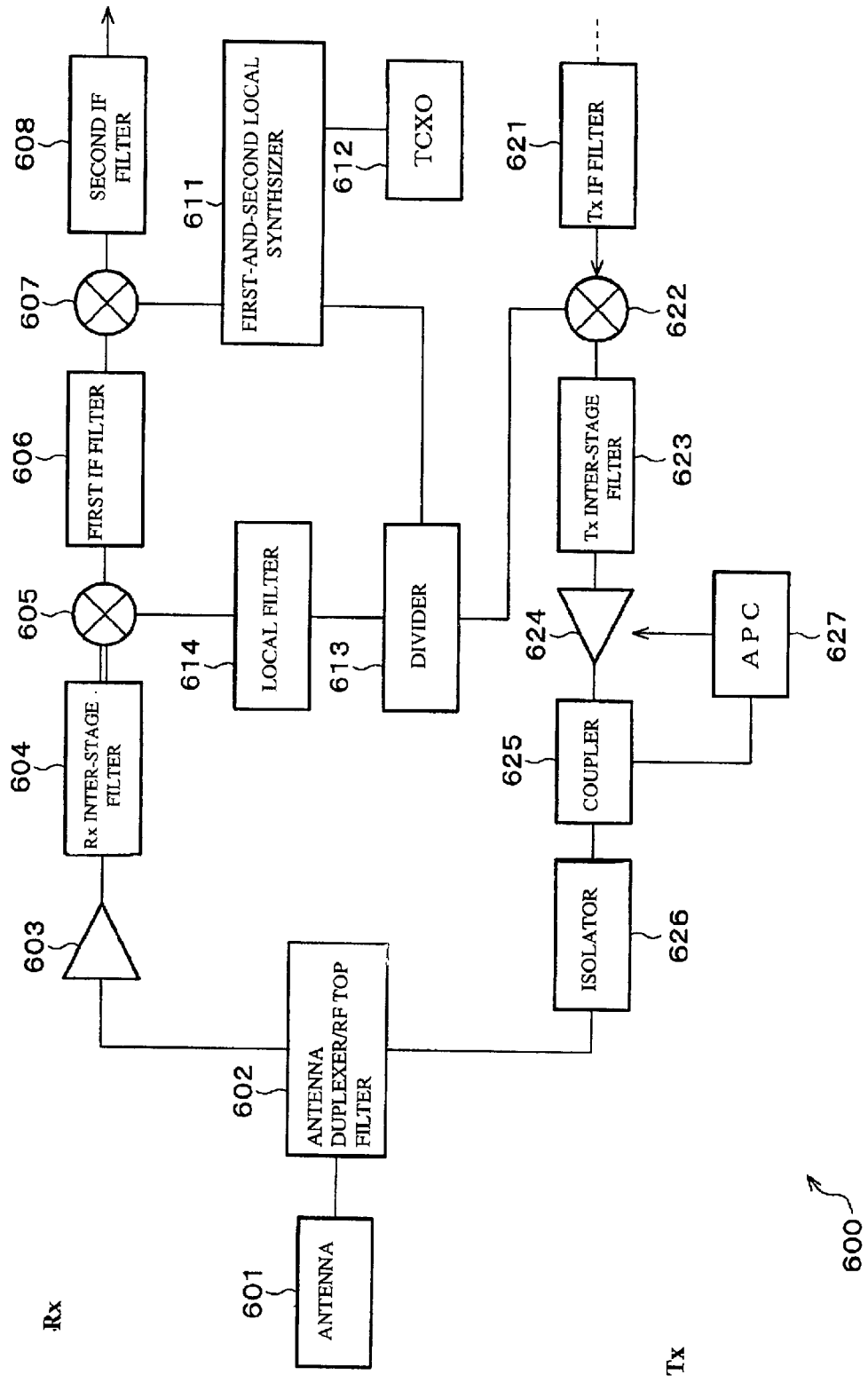
FIG. 18 is a block diagram of a main portion of a communication apparatus according to another preferred embodiment of the present invention.
Figure 19:
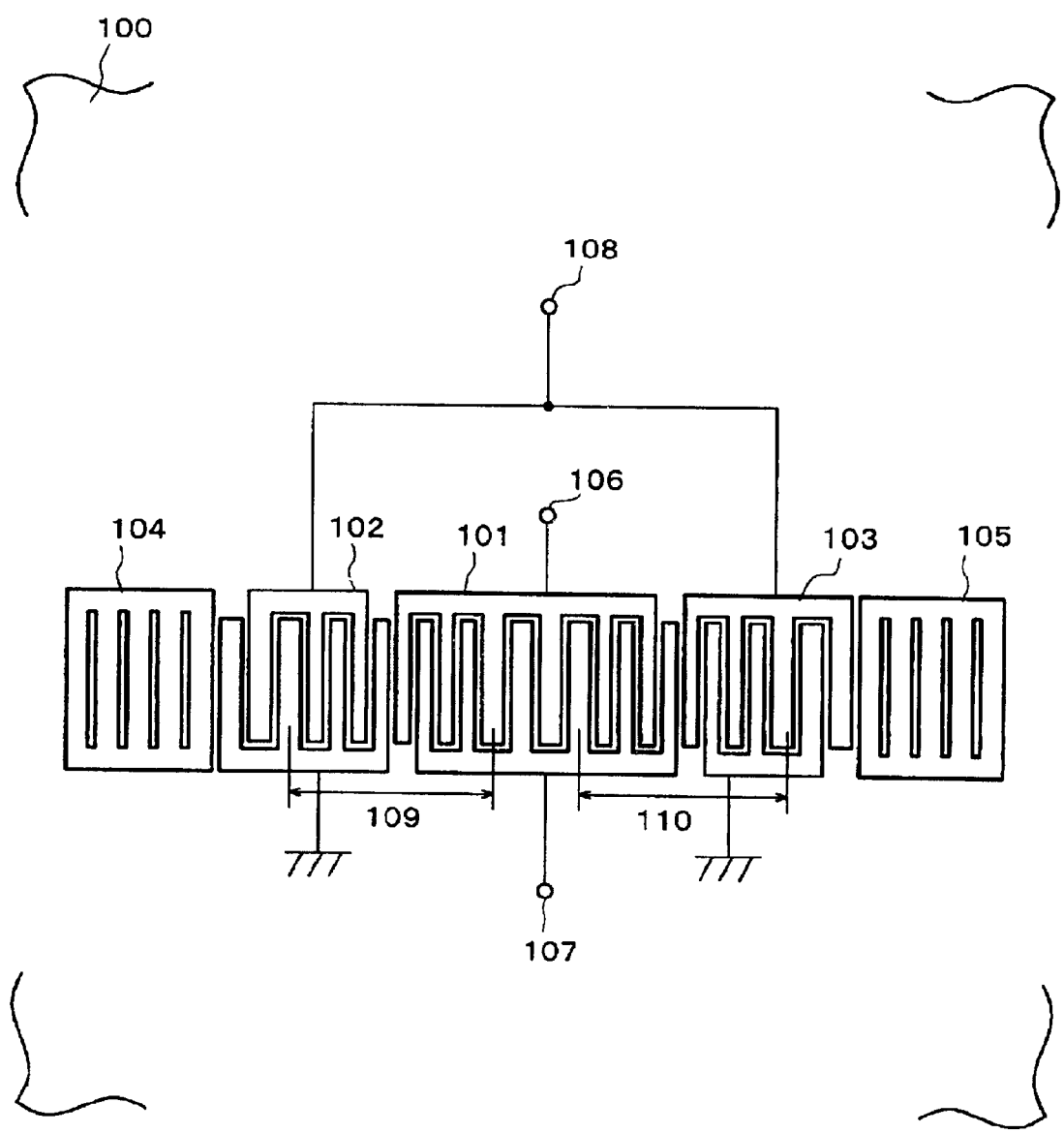
FIG. 19 is a schematic diagram of a SAW filter in the conventional art having a balance-to-unbalance conversion function.
Figure 20:
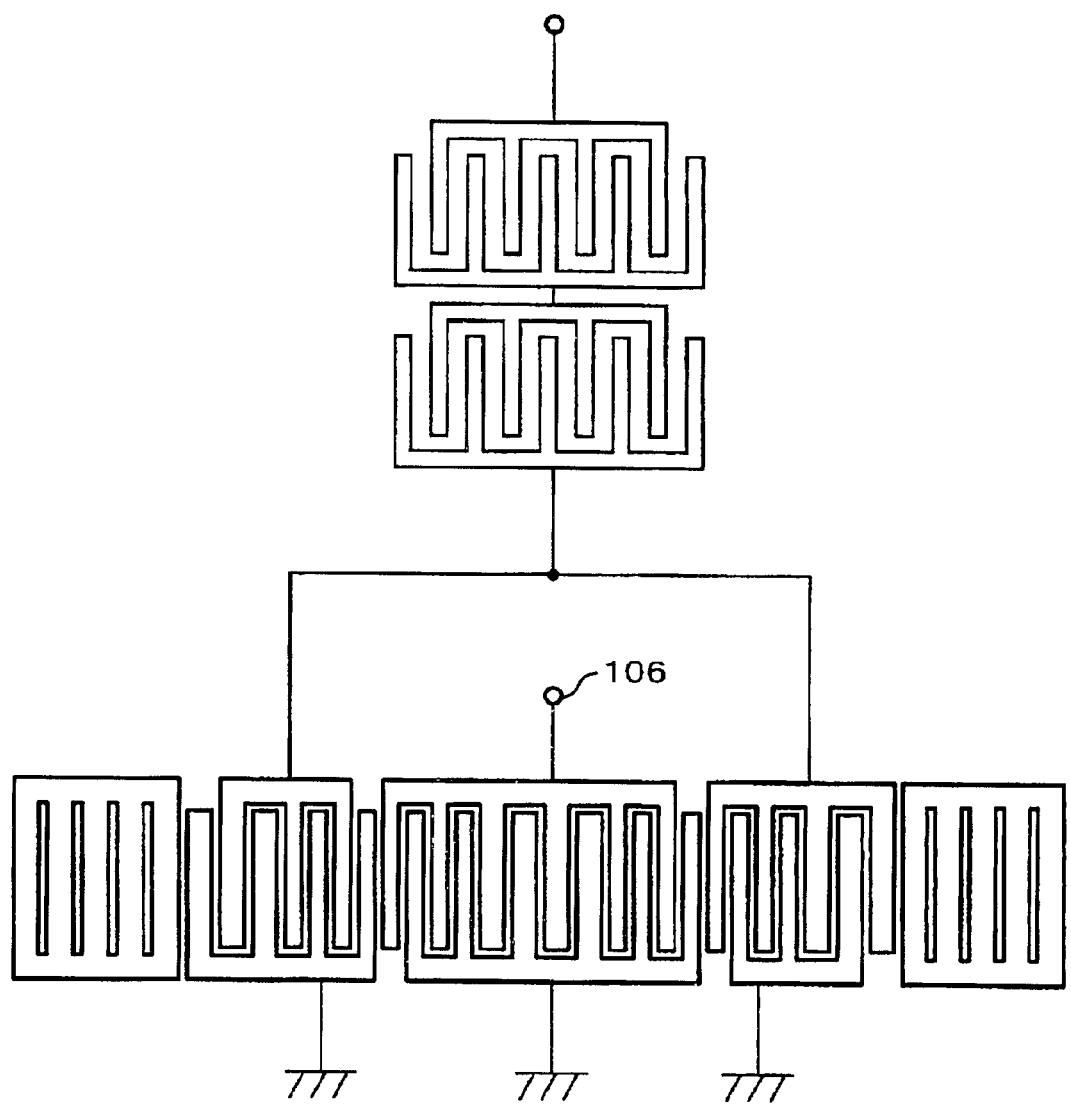
FIG. 20 is a schematic diagram of the SAW in the conventional art, showing that one of the balanced signal terminals is connected to the ground.
Figure 21:
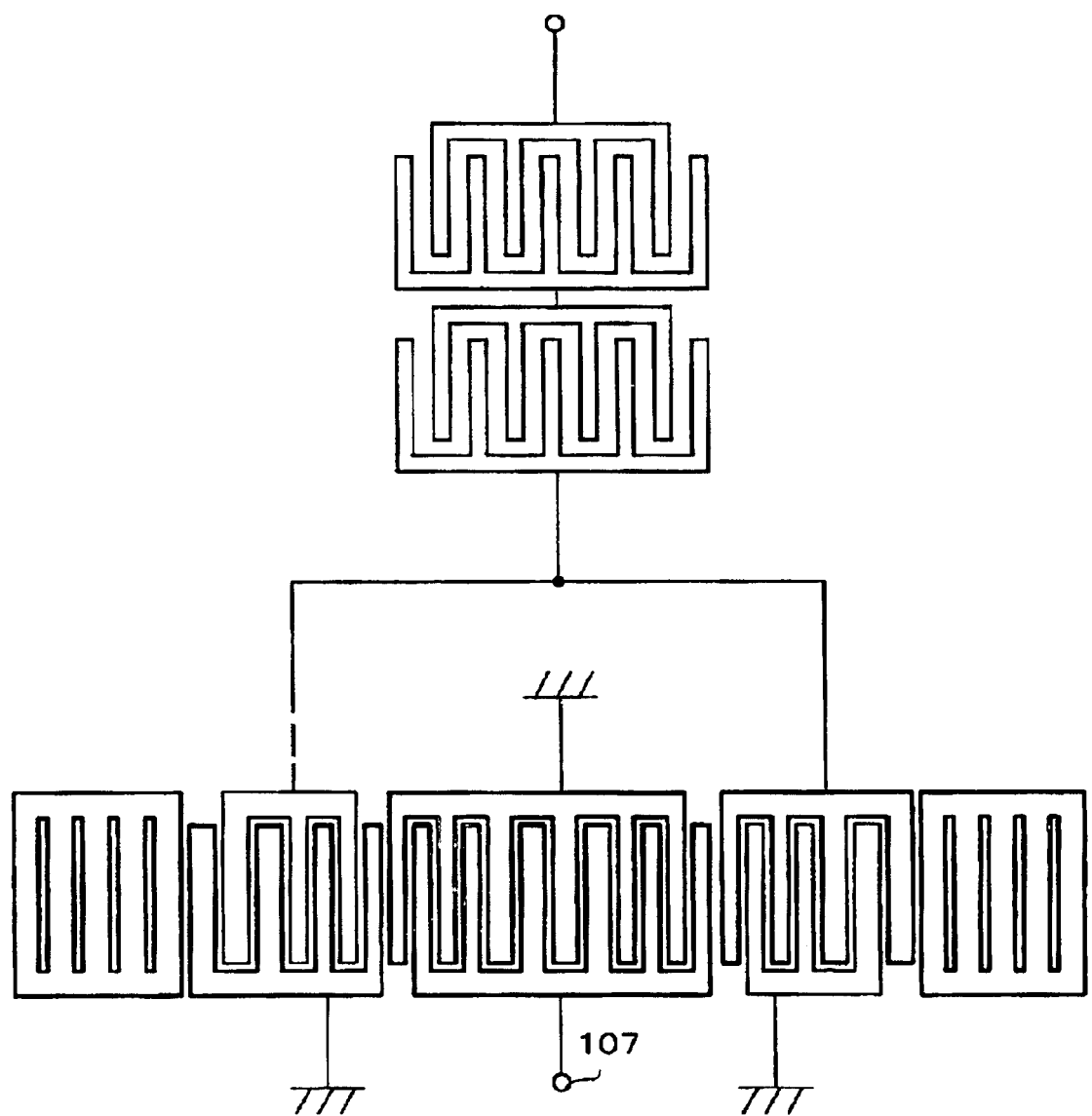
FIG. 21 is a schematic diagram of the SAW filter in the conventional art, showing that the other balanced signal terminal is connected to the ground.
Figure 22:
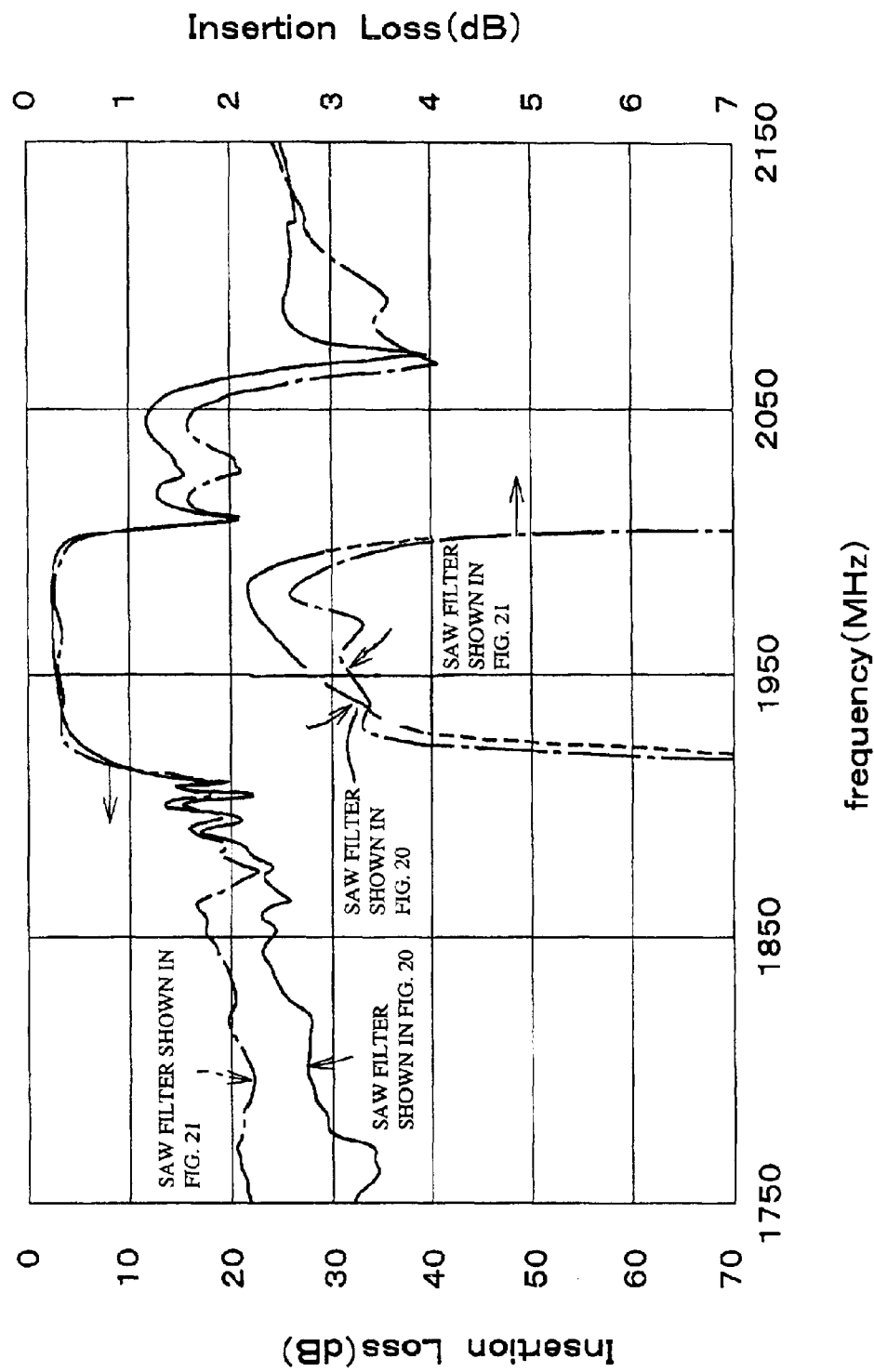
FIG. 22 is a graph showing the difference between the frequency-amplitude characteristics of the SAW filters shown in FIGS. 20 and 21.

A description is now given, with reference to FIG. 18, of a communication apparatus 600 using a SAW filter according to any of the first to third preferred embodiments of the present invention. In the communication apparatus 600, a receiver (Rx) for reception includes an antenna 601, an antenna duplexer/RF top filter 602, an amplifier 603, Rx inter-stage filter 604, a mixer 605, a first IF filter 606, a mixer 607, a second IF filter 608, a first-and-second local synthesizer 611, a temperature compensated crystal oscillator (TCXO) 612, a divider 613, and a local filter 614.

Preferably, two balanced signals are transmitted from the Rx inter-stage filter 604 to the mixer 605, as indicated by two lines in FIG. 18, in order to maintain balance.

In the communication apparatus 600, a transmitter (Tx) for transmission includes the antenna 601, the antenna duplexer/RF top filter 602, a Tx IF filter 621, a mixer 622, a Tx inter-stage filter 623, an amplifier 624, a coupler 625, an isolator 626, and an automatic power control (APC) 627. The antenna 601 and the antenna duplexer/RF top filter 602 are shared by the receiver and the transmitter.

The SAW filter according to any of the first to third preferred embodiments may be suitably used as the Rx inter-stage filter 604, the first IF filter 606, the Tx IF filter 621, and the Tx inter-stage filter 623.

The SAW filter according to preferred embodiments of the present invention has both a filtering function and a balance-to-unbalance conversion function, and exhibits a satisfactory characteristic, i.e., an ideal phase characteristic between balanced signals. Therefore, a communication apparatus according to a preferred embodiment of the present invention, which includes such a SAW filter, has a much higher transmission characteristic.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A surface acoustic wave filter comprising:
   a piezoelectric substrate;
   an interdigital transducer set disposed on the piezoelectric substrate, the interdigital transducer set including, along a surface acoustic wave propagation direction, a plurality of interdigital transducers for converting an input electrical signal into a surface acoustic wave and outputting the surface acoustic wave, and for converting a propagating surface acoustic wave into an output electrical signal and outputting the output electrical signal; and
   a balanced signal terminal connected to the interdigital transducer set; wherein
   the interdigital transducer set is asymmetric with respect to an imaginary axis which is located at the approximate center of the interdigital transducer set in the surface acoustic wave propagation direction and which is substantially perpendicular to the surface acoustic wave propagation direction; and
   the ratios of the electrode finger widths to the pitches of the interdigital transducer set are different such that the interdigital transducer set is asymmetric with respect to the imaginary axis.

2. A surface acoustic wave filter according to claim 1, wherein the interdigital transducer set includes an odd number of interdigital transducers, and the imaginary alas is located at an approximate central portion of the interdigital transducer which is centrally located among the plurality of the interdigital transducers, and is substantially perpendicular to the surface acoustic wave propagation direction.

3. A surface acoustic wave filter according to claim 1, wherein the distances between adjacent interdigital transducers in the interdigital transducer set are different such that the interdigital transducer set is asymmetric with respect to the imaginary axis.

4. A surface acoustic wave filter according to claim 1, wherein at least one surface acoustic wave resonator is connected at least in series or in parallel to the interdigital transducer set.

5. A surface acoustic wave filter according to claim 1, wherein the interdigital transducer set defines a longitudinally coupled resonator SAW filter unit.

6. A surface acoustic wave filter according to claim 5, further comprising a plurality of the surface acoustic wave resonators connected in series to the longitudinally coupled resonator SAW filter unit.

7. A surface acoustic wave filter according to claim 1, wherein the piezoelectric substrate is one of a 40±5° Y-cut X-propagating $LiTaO_3$ substrate, a 64° to 72° Y-cut X-propagating $LiNbO_3$, and a 41° Y-cut X-propagating $LiNbO_3$.

8. A surface acoustic wave filter according to claim 1, wherein the interdigital transducer set includes reflectors arranged to sandwich the interdigital transducer.

9. A surface acoustic wave filter according to claim 1, wherein the interdigital transducer set contains a single longitudinally coupled resonator SAW filter unit having three interdigial transducers and two SAW resonators connected in series to the SAW filter unit.

10. A surface acoustic wave filter according to claim 1, wherein the interdigital transducer set contains a single longitudinally coupled resonator SAW filter unit having four interdigital transducers and two SAW resonators connected in series to the SAW filter unit.

11. A surface acoustic wave filter according to claim 1, further comprising a surface acoustic wave resonator connected in parallel to the interdigital transducer set.

12. A surface acoustic wave filter according to claim 1, further comprising two longitudinally coupled resonator surface acoustic wave filter units connected in a cascade arrangement.

13. A surface acoustic wave filter according to claim 1, wherein the surface acoustic wave filter performs both a filtering function and a balance-to-unbalance conversion function.

14. A communication apparatus comprising the surface acoustic wave filter according to claim 1.

15. A surface acoustic wave filter comprising:
    a piezoelectric substrate;
    an interdigital transducer set disposed on the piezoelectric substrate, the interdigital transducer set including, along a surface acoustic wave propagation direction, a plurality of interdigital transducers for converting an input electrical signal into a surface acoustic wave and outputting the surface acoustic wave, and for converting a propagating surface acoustic wave into an output electrical signal and outputting the output electrical signal; and
    a balanced signal terminal and an unbalanced signal terminal connected to the interdigital transducer set for providing a balanced-to-unbalanced conversion function; wherein
    the interdigital transducer set is asymmetric with respect to an imaginary axis which is located at the approximate center of the interdigital transducer set in the surface acoustic wave propagation direction and which is substantially perpendicular to the surface acoustic wave propagation direction; and
    the pitches of the interdigital transducer set are different such that the interdigital transducer set is asymmetric with respect to the imaginary axis.

16. A surface acoustic wave fitter according to claim 15, wherein the interdigital transducer set includes an odd number of interdigital transducers, and the imaginary axis is located at an approximate central portion of the interdigital transducer which is centrally located among the plurality of the interdigital transducers, and is substantially perpendicular to the surface acoustic wave propagation direction.

17. A surface acoustic wave filter according to claim 15, wherein the distances between adjacent interdigital transducers in the interdigital transducer set are different such that the interdigital transducer set is asymmetric with respect to the imaginary axis.

18. A surface acoustic wave filter according to claim 15, wherein at least one surface acoustic wave resonator is connected at least in series or in parallel to the interdigital transducer set.

19. A surface acoustic wave filter according to claim 15, wherein the interdigital transducer set defines a longitudinally coupled resonator SAW filter unit.

20. A surface acoustic wave filter according to claim 19, further comprising a plurality of the surface acoustic wave resonators connected in series to the longitudinally coupled resonator SAW filter unit.

21. A surface acoustic wave filter according to claim 15, wherein the piezoelectric substrate is one of a 40±5° Y-cut X-propagating $LiTaO_3$ substrate, a 64° to 72° Y-cut X-propagating $LiNbO_3$, and a 41° Y-cut X-propagating $LiNbO_3$.

22. A surface acoustic wave filter according to claim 15, wherein the interdigital transducer set includes reflectors arranged to sandwich the interdigital transducers.

23. A surface acoustic wave filter according to claim 15, wherein the interdigital transducer set contains a single longitudinally coupled resonator SAW filter unit having three interdigital transducers and two SAW resonators connected in series to the SAW filter unit.

24. A surface acoustic wave filter according to claim 15, wherein the interdigital transducer set contains a single longitudinally coupled resonator SAW filter unit having four interdigital transducers and two SAW resonators connected in series to the SAW filter unit.

25. A surface acoustic wave filter according to claim 15, further comprising a surface acoustic wave resonator connected in parallel to the interdigital transducer set.

26. A surface acoustic wave filter according to claim 15, further comprising two longitudinally coupled resonator surface acoustic wave filter units connected in a cascade arrangement.

27. A surface acoustic wave filter according to claim 15, wherein the surface acoustic wave filter performs a filtering function.

28. A communication apparatus comprising the surface acoustic wave filter according to claim 15.

29. A surface acoustic wave filter comprising:

a piezoelectric substrate;

an interdigital transducer set disposed on the piezoelectric substrate, the interdigital transducer set including, along a surface acoustic wave propagation direction, a plurality of interdigital transducers for converting an input electrical signal into a surface acoustic wave and outputting the surface acoustic wave, and for converting a propagating surface acoustic wave into an output electrical signal and outputting the output electrical signal; and a balanced signal terminal and an unbalanced signal terminal connected to the interdigital transducer set for providing a balanced-to-unbalanced conversion function; wherein the interdigital transducer set is asymmetric with respect to an imaginary axis which is located at the approximate center of the interdigital transducer set in the surface acoustic wave propagation direction and which is substantially perpendicular to the surface acoustic wave propagation direction; and the interdigital transducer set includes narrower-pitch electrode finger portions at portions where two interdigital transducers are adjacent to each other, each narrower-pitch electrode finger portion including several electrode fingers having a smaller pitch than that of the other electrode fingers, and the pitches of the narrower-pitch electrode finger portions are different such that the interdigital transducer set is asymmetric with respect to the imaginary axis.

30. A surface acoustic wave filter according to claim 29, wherein the interdigital transducer set includes an odd number of interdigital transducers, and the imaginary axis is located at an approximate central portion of the interdigital transducer which is centrally located among the plurality of the interdigital transducers, and is substantially perpendicular to the surface acoustic wave propagation direction.

31. A surface acoustic wave filter according to claim 29, wherein the distances between adjacent interdigital transducers in the interdigital transducer set are different such that the interdigital transducer set is asymmetric with respect to the imaginary axis.

32. A surface acoustic wave filter according to claim 29, wherein at least one surface acoustic wave resonator is connected at least in series or in parallel to the interdigital transducer set.

33. A surface acoustic wave filter according to claim 29, wherein the interdigital transducer set defines a longitudinally coupled resonator SAW filter unit.

34. A surface acoustic wave filter according to claim 33, further comprising a plurality of the surface acoustic wave resonators connected in series to the longitudinally coupled resonator SAW filter unit.

35. A surface acoustic wave filter according to claim 29, wherein the piezoelectric substrate is one of a 40±5° Y-cut X-propagating $LiTaO_3$ substrate, a 64° to 72° Y-cut X-propagating $LiNbO_3$, and a 41° Y-cut X-propagating $LiNbO_3$.

36. A surface acoustic wave filter according to claim 29, wherein the interdigital transducer set includes reflectors arranged to sandwich the interdigital transducers.

37. A surface acoustic wave filter according to claim 29, wherein the interdigital transducer set contains a single longitudinally coupled resonator SAW filter unit having three interdigital transducers and two SAW resonators connected in series to the SAW filter unit.

38. A surface acoustic wave filter according to claim 29, wherein the interdigital transducer set contains a single longitudinally coupled resonator SAW filter unit having four interdigital transducers and two SAW resonators connected in series to the SAW filter unit.

39. A surface acoustic wave filter according to claim 29, further comprising a surface acoustic wave resonator connected in parallel to the interdigital transducer set.

40. A surface acoustic wave filter according to claim 29, further comprising two longitudinally coupled resonator surface acoustic wave filter units connected in a cascade arrangement.

41. A surface acoustic wave filter according to claim 29, wherein the surface acoustic wave filter performs a filtering function.

42. A communication apparatus comprising the surface acoustic wave filter according to claim 29.

* * * * *